(12) United States Patent
Bakalski

(10) Patent No.: US 9,166,640 B2
(45) Date of Patent: Oct. 20, 2015

(54) ADJUSTABLE IMPEDANCE MATCHING NETWORK

(75) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 487 days.

(21) Appl. No.: 13/371,001

(22) Filed: Feb. 10, 2012

(65) Prior Publication Data
US 2013/0207739 A1 Aug. 15, 2013

(51) Int. Cl.
*H03H 7/40* (2006.01)
*H04B 1/18* (2006.01)

(52) U.S. Cl.
CPC . *H04B 1/18* (2013.01); *H03H 7/40* (2013.01); *H03J 2200/10* (2013.01); *H03J 2200/15* (2013.01)

(58) Field of Classification Search
CPC .................................. H03H 7/38; H03H 7/40
USPC ...................... 333/32, 33, 17.3, 124, 125, 126
See application file for complete search history.

(56) References Cited

U.S. PATENT DOCUMENTS

| | | | |
|---|---|---|---|
| 4,951,009 A | 8/1990 | Collins | |
| 5,808,527 A * | 9/1998 | De Los Santos | 333/205 |
| 5,874,926 A | 2/1999 | Tsuru et al. | |
| 6,362,709 B1 | 3/2002 | Paxman et al. | |
| 6,765,540 B2 | 7/2004 | Toncich | |
| 6,885,353 B2 | 4/2005 | Kurihara | |
| 6,992,543 B2 * | 1/2006 | Luetzelschwab et al. | 333/32 |
| 7,151,411 B2 | 12/2006 | Martin et al. | |
| 7,831,219 B2 | 11/2010 | Heuermann et al. | |
| 7,907,033 B2 | 3/2011 | Morris, III et al. | |
| 8,164,387 B1 | 4/2012 | Apel et al. | |
| 8,760,239 B2 | 6/2014 | Schmidhammer | |
| 8,797,119 B2 | 8/2014 | Gu et al. | |
| 8,836,602 B2 | 9/2014 | Hutcheson | |
| 2003/0030504 A1 | 2/2003 | Dixit et al. | |
| 2004/0251984 A1 * | 12/2004 | Javor | 333/32 |
| 2010/0030504 A1 | 2/2010 | Simpson | |
| 2010/0085129 A1 | 4/2010 | Shuto et al. | |
| 2010/0164645 A1 | 7/2010 | Kobayashi et al. | |
| 2011/0075449 A1 | 3/2011 | Fouquet | |
| 2012/0206215 A1 | 8/2012 | Winslow | |
| 2014/0049442 A1 | 2/2014 | Yen et al. | |

FOREIGN PATENT DOCUMENTS

| | | |
|---|---|---|
| CN | 101438459 A | 5/2009 |
| CN | 101814903 A | 8/2010 |

(Continued)

*Primary Examiner* — Stephen E Jones
(74) *Attorney, Agent, or Firm* — Slater & Matsil, L.L.P.

(57) ABSTRACT

An adjustable impedance matching network includes a first terminal, a second terminal, a reference potential terminal, a transmission line transformer with a first inductor path and a second inductor path. A semiconductor switching element is configured to bridge a sub-section of the first inductor path or the second inductor path to thereby adjust an inductance of the first inductor path or the second inductor path. According to an alternative embodiment, the impedance matching network includes a selector switch to selectively connect one of a plurality of inductor nodes with at least one of the first terminal and the second terminal. Further embodiments relate to an integrated circuit for adjustable impedance matching with a transmission line transformer formed by first and second inductor paths that are implemented as conductive paths at or in a substrate of the integrated circuit.

32 Claims, 29 Drawing Sheets

(56) References Cited

FOREIGN PATENT DOCUMENTS

| | | |
|---|---|---|
| CN | 101917166 A | 12/2010 |
| DE | 3644476 A1 | 7/1988 |
| DE | 69023417 | 5/1996 |
| DE | 19644339 C1 | 6/1998 |
| DE | 19945662 A1 | 4/2001 |
| DE | 10063606 A1 | 7/2001 |
| DE | 10 2005 058 875 A1 | 6/2007 |

* cited by examiner

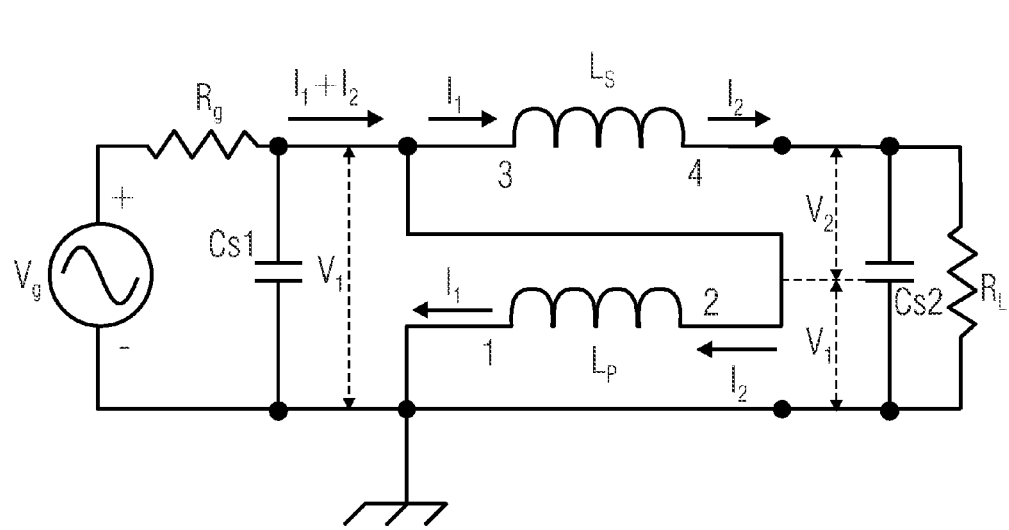
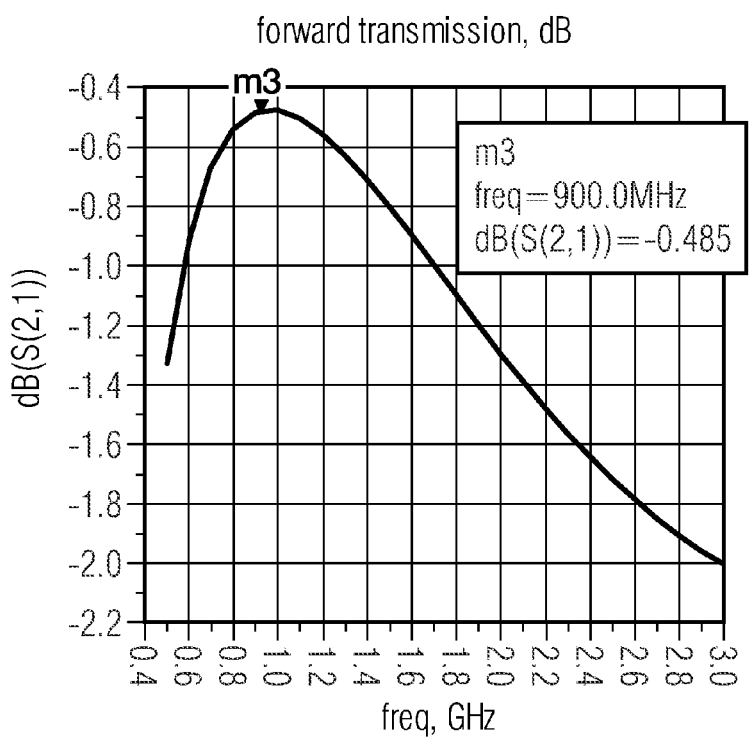
FIG 8
| FIG 8A | FIG 8B |
FIG 8A

50 Ohm
unmatched
m3
freq=900.0MHz
S(1,1)=0.062 / -121.119
impedance = Z0 * (0.932 - j0.100)
m4
freq=2.700GHz
S(1,1)=0.642 / -135.403
impedance = Z0 * (0.253 - j0.387)
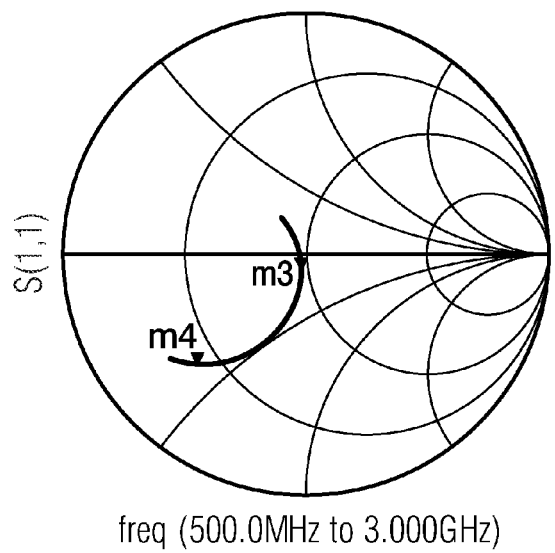
input reflection coefficient
freq (500.0MHz to 3.000GHz)
m1
freq=800.0MHz
dB(S(2,1))=-0.816
m5
freq=900.0MHz
dB(S(2,1))=-0.771
m2
freq=1.900.0GHz
dB(S(2,1))=-1.550
m6
freq=2.700GHz
dB(S(2,1))=-3.521
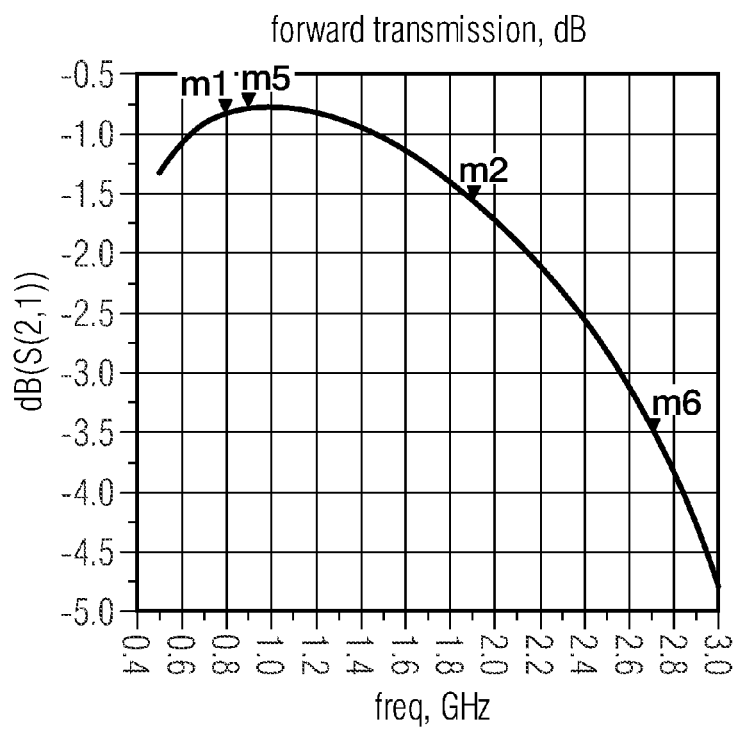
FIG 21

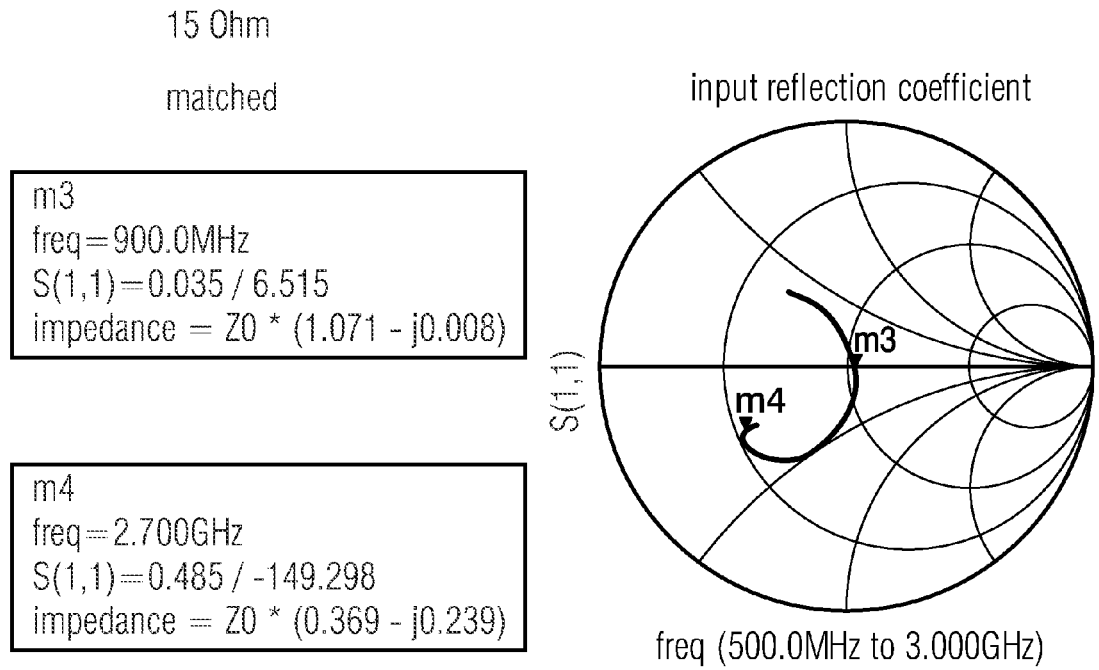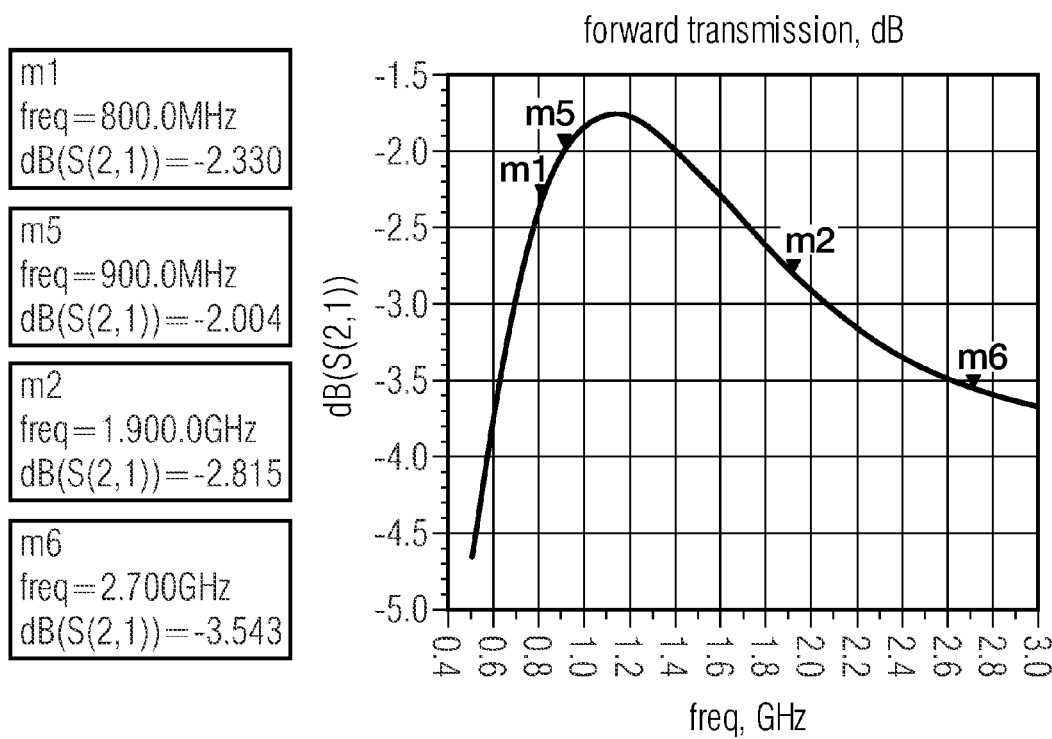
FIG 22

110 Ohm
matched
m3
freq=900.0MHz
S(1,1)=0.060 / -94.996
impedance = Z0 * (0.983 - j0.117)
m4
freq=2.700GHz
S(1,1)=0.906 / -153.254
impedance = Z0 * (0.052 - j0.237)
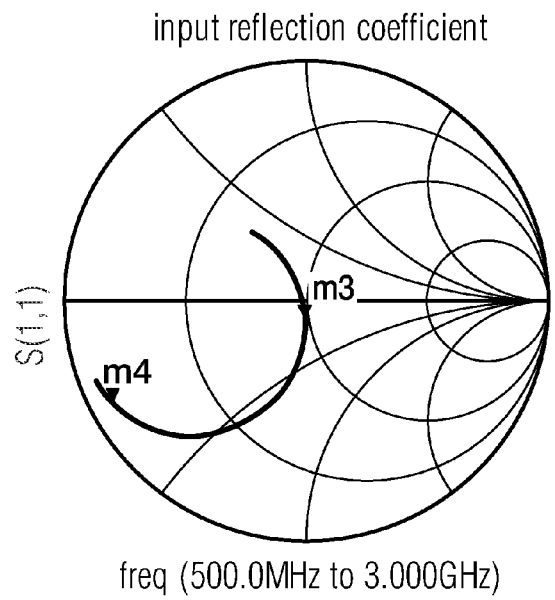
input reflection coefficient
freq (500.0MHz to 3.000GHz)
m1
freq=800.0MHz
dB(S(2,1))=-1.956
m5
freq=900.0MHz
dB(S(2,1))=-1.856
m2
freq=1.900.0GHz
dB(S(2,1))=-5.445
m6
freq=2.700GHz
dB(S(2,1))=-13.560
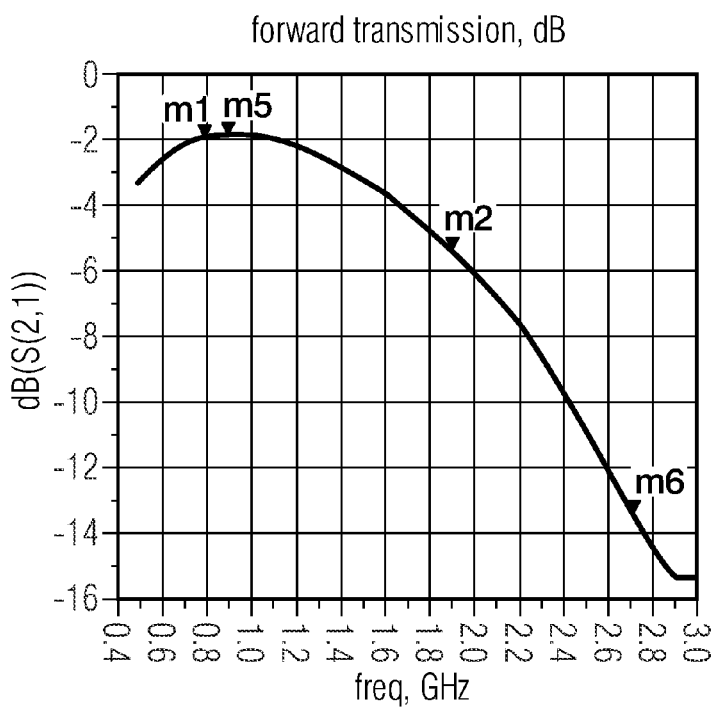
FIG 23

ADJUSTABLE IMPEDANCE MATCHING NETWORK

TECHNICAL FIELD

Embodiments of the present invention relate to an impedance matching network that may be provided between a source of electrical power and a consumer of electrical power. Embodiments of the present invention relate to an integrated circuit for impedance matching. Embodiments of the present invention relate to a method for adjusting an impedance matching network.

BACKGROUND

In electrical or electronic systems, it is often desirable to design the input impedance of an electrical load (or the output impedance of a source of electrical energy) to maximize the power transfer and/or minimize reflections from the load. Maximum power transfer is typically obtained when the load impedance is equal to the complex conjugate of the source impedance. In contrast, minimum reflection can typically be achieved when the load impedance is equal to the source impedance.

Current radio frequency (RF) or high-frequency (HF) front end systems typically still comprise, at the transmitter end, a power amplifier (PA) for amplifying the signal to the required level, a filter (typically a harmonic filter), a power detector, and an antenna switch that performs a switching between the transmission bands, the reception bands, as well as between transmitter operation and receiver operation. Thereafter the signal is typically forwarded via an antenna impedance matching network to the antenna.

This antenna impedance matching is designed that, averaged over all use cases, frequencies and operating modes, as well as over their respective probabilities, an optimum is achieved. As can readily be seen, the optimum is only reached very seldom, because the frequency spectrum of the mobile communications frequencies constantly becomes broader and also the antenna itself provides very different matching for all frequencies and environmental conditions that may occur.

SUMMARY OF THE INVENTION

Embodiments of the present invention provide an adjustable impedance matching network comprising a first terminal, a second terminal, a reference potential terminal, a transmission line transformer, and a semiconductor switching element. The transmission line transformer has a first inductor path and a second inductor path. The semiconductor switching element is configured to bridge a subsection of the first inductor path or the second inductor path to thereby adjust an inductance of the first inductor path or the second inductor path.

Further embodiments of the present invention provide an adjustable impedance matching network comprising a first terminal, a second terminal, a reference potential terminal, a transmission line transformer, and a selector switch. The transmission line transformer comprises a first inductor path and a second inductor path. The selector switch is configured to selectively connect one of a plurality of inductor nodes of the first inductor path and the second inductor path with at least one of the first terminal and the second terminal.

Furthermore, embodiments of the present invention provide an integrated circuit for adjustable impedance matching. The integrated circuit comprises a substrate, a first connection pad, a second connection pad, a first inductor path, a second inductor path, and a switching element. The first inductor path is formed by a conductive path at or in the substrate and conductively couplable between the first pad and the second pad. The second inductor path is formed by a conductive path at or in the substrate, wherein the first inductor path and the second inductor path are mutually inductively coupled to form a transmission line transformer. The switching element is configured for bridging a subsection of the first inductor path or the second inductor path to thereby adjust an inductance of the first inductor path or the second inductor path.

Further embodiments of the present invention provide a method for adjusting an adjustable impedance matching network. The method comprises controlling a semiconductor switching element in order to bridge (or to activate or to deactivate) a subsection of a first inductor path or a second inductor path of a transmission line transformer, thereby adjusting an inductance of a first inductor path or the second inductor path.

BRIEF DESCRIPTION OF THE DRAWINGS

Embodiments of the present invention are described herein, making reference to the appended drawings.

FIG. 8a shows a Pi-network comprising a Ruthroff transformer, a graph illustrating the forward transmission of the Pi-network over frequency;

FIG. 21 shows a Smith chart and a diagram illustrating a frequency dependency of the input reflection coefficient and the forward transmission of an adjustable impedance matching network according to the disclosed teachings in an unmatched configuration (50 ohm);

FIG. 22 shows a Smith chart and a diagram illustrating a frequency dependent behavior of the input reflection coefficient and the forward transmission of an adjustable impedance matching network according to the disclosed teachings in a configuration for impedance matching to 15 ohm;

FIG. 23 shows a Smith chart and a diagram illustrating a frequency dependent behavior of the input reflection coefficient and the forward transmission of an adjustable impedance matching network according to the disclosed teachings in a configuration for impedance matching to 110 ohm;

Equal or equivalent elements or elements with equal or equivalent functionality are denoted in the following description by equal or similar reference numerals.

DETAILED DESCRIPTION OF ILLUSTRATIVE EMBODIMENTS

In the following description, a plurality of details are set forth to provide a more thorough explanation of the embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1:
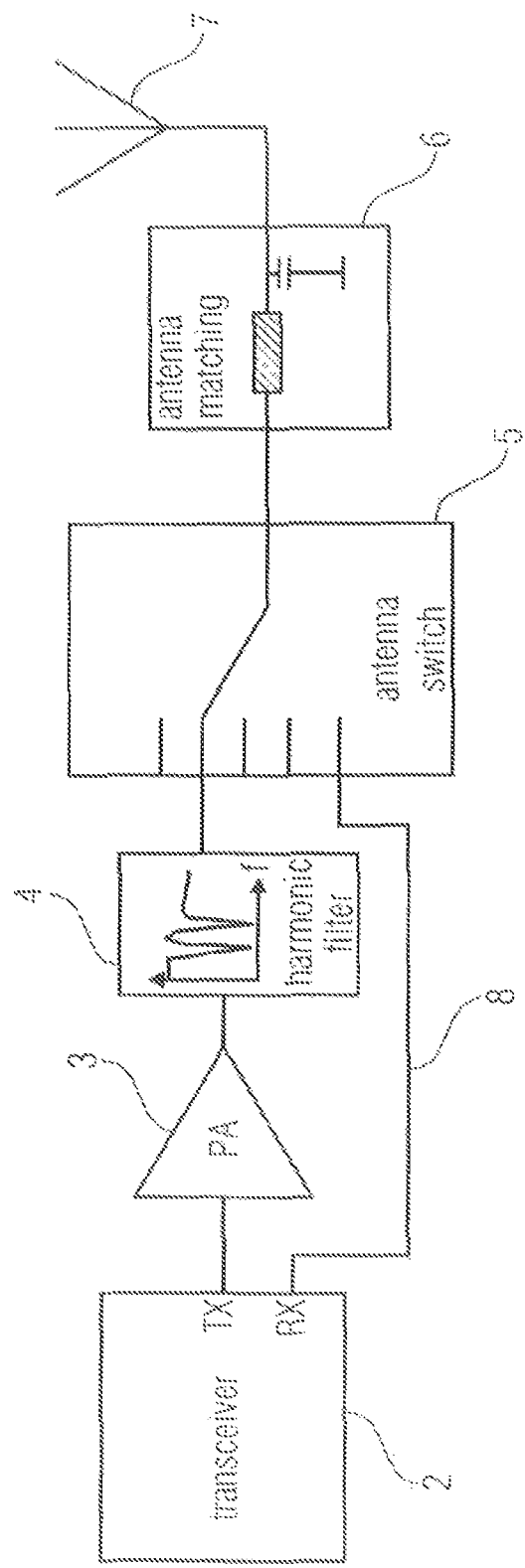
FIG. 1 shows a schematic block diagram of an RF or HF frontend system according to the state of the art.

FIG. 1 shows a schematic block diagram of a simplified radio frequency (RF) or high-frequency (HF) frontend system as it may be used, for example, in a mobile station or a base station of a mobile communications network, such as a cell phone or a base transceiver station. The front end system comprises a transceiver 2, a power amplifier (PA) 3, a harmonic filter 4, an antenna switch 5, an antenna matching network 6, and an antenna 7. When functioning in a transmitter operating mode, the transceiver 2 provides a transmit signal at its output TX to the power amplifier 3. An amplified transmit signal provided by the power amplifier 3 is fed to the harmonic filter 4, which reduces frequency components of the amplified transmit signal outside an intended transmit frequency range. An output of the harmonic filter 4 is connected to one of the plurality of inputs of the antenna switch 5. In the example of FIG. 1, the antenna switch 5 is currently configured to connect the input to an antenna switch output. The other inputs of the antenna switch 5 may be connected to respective outputs of further harmonic filters (not illustrated in FIG. 1) having a different frequency response than the harmonic filter 4 so that the HF frontend system illustrated in FIG. 1 may be configured to support several transmit frequencies and/or several mobile communications standards. The antenna switch 5 is further configured to connect the antenna matching network 6 with an RX input (i.e., a receiver input) of the transceiver 2 via a connection 8, when the HF frontend system operates in a receiver mode.

The antenna switch output is connected to an input of the antenna matching network 6. The antenna matching network 6 is, in the illustrated example, implemented as a basic LC network comprising a series inductance and a capacitance connected in parallel to an output of the antenna matching network 6. The output of the antenna matching network 6 is connected to the antenna 7.

As the HF frontend system can be reconfigured by means of the antenna switch 5 to support several frequencies, mobile communications standards, and/or further parameters related to the transmission or reception of radio signals, the antenna matching network 6 has to be selected taking into account the various possible use cases, frequencies and operating modes, as well as their respective probabilities in order to provide a weighted optimum. This task becomes more and more difficult, because the frequency spectrum of the mobile communications frequencies is getting wider and wider and also the antenna itself requires different impedance matching settings for different environmental conditions. In addition, the problem of antenna mismatch due to the different environment of the antenna has to be considered. For example, the impedance of an antenna may vary very strongly, when the antenna is being touched by, e.g., a finger of a mobile phone user, as could be observed with some mobile phone models sold in the past. Moreover, a mismatch leads to additional non-linearities at the power amplifier 3 and to a modification of the filter behavior of the harmonic filter 4, because the mismatch is passed through the antenna switch 5. In consequence, the overall system is negatively affected at several points by the mismatch. These problems are more exactly considered only recently, because mobile communications systems only used to be specified for 50 Ohm measuring systems.

For some time past, additional requirements with respect to the total radiated power (TRP) exist, which have to be fulfilled by mobile communications devices for specific network providers. This means that for a wide range of mismatches the system has to reach the required radiated power.

Figure 2:
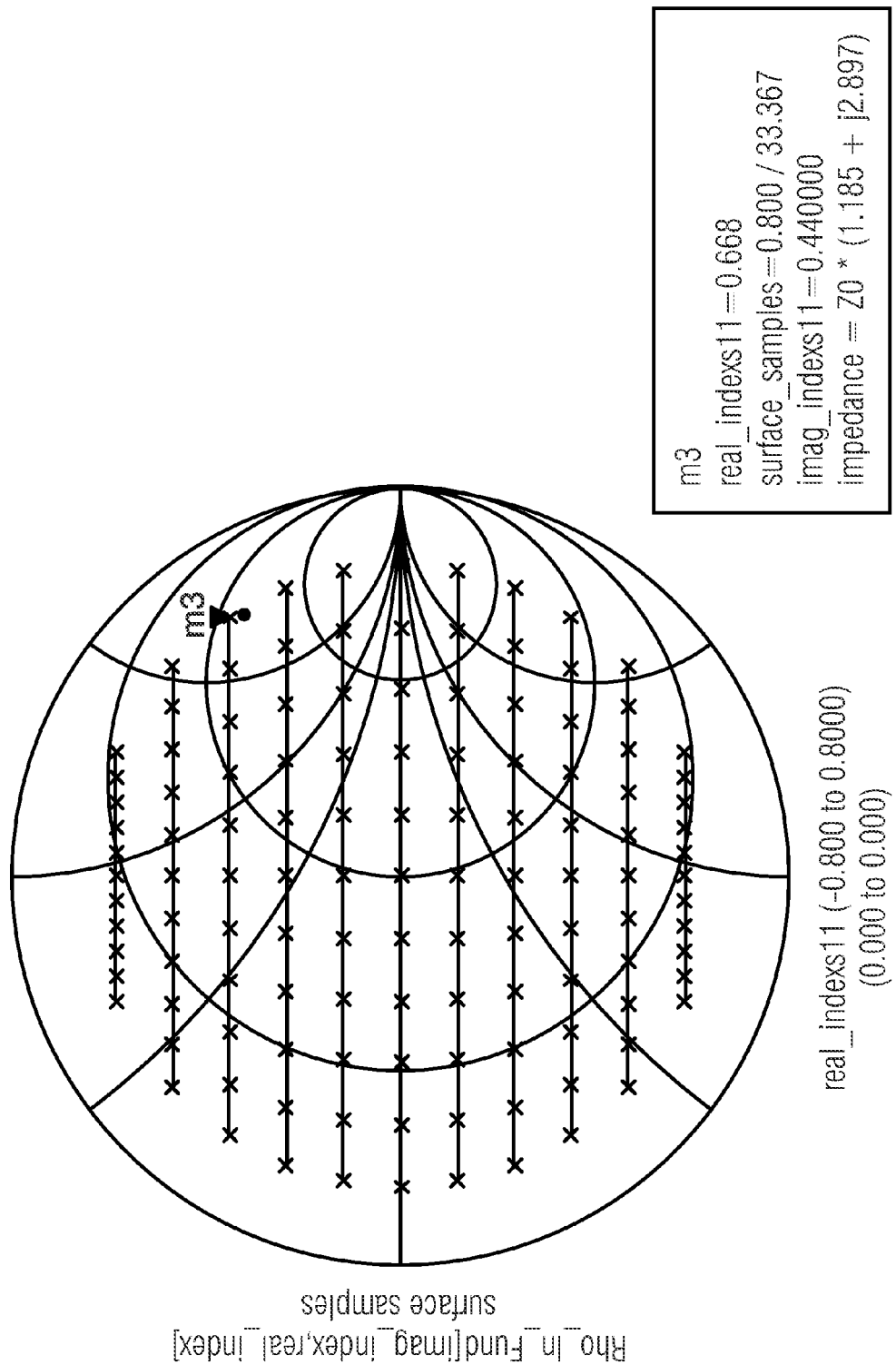
FIG. 2 shows a Smith chart illustrating a plurality of test cases for a mismatch test as required by some mobile communications standards.

FIG. 2 illustrates a plurality of test cases in a Smith chart representation that a HF or RF frontend system has to pass in order to be admitted for operation in certain mobile communications networks. In particular, FIG. 2 shows the possible impedance inside a circle of a given VSWR (Voltage Standing Wave Ratio), here for VSWR=10. Thus, every mismatch below VSWR=10 may be a valid point, and as this can be infinite much, the amount of points is limited to 121 (11 lines with each line having 11 points) for the purpose of illustration in FIG. 2.

It can be expected that simple arrangements might not be sufficient in the future for meeting current and future requirements. For this reason, switchable matching networks are currently used in some first devices, where in accordance with the frequency being used a modification of the matching is performed.

Figure 3:
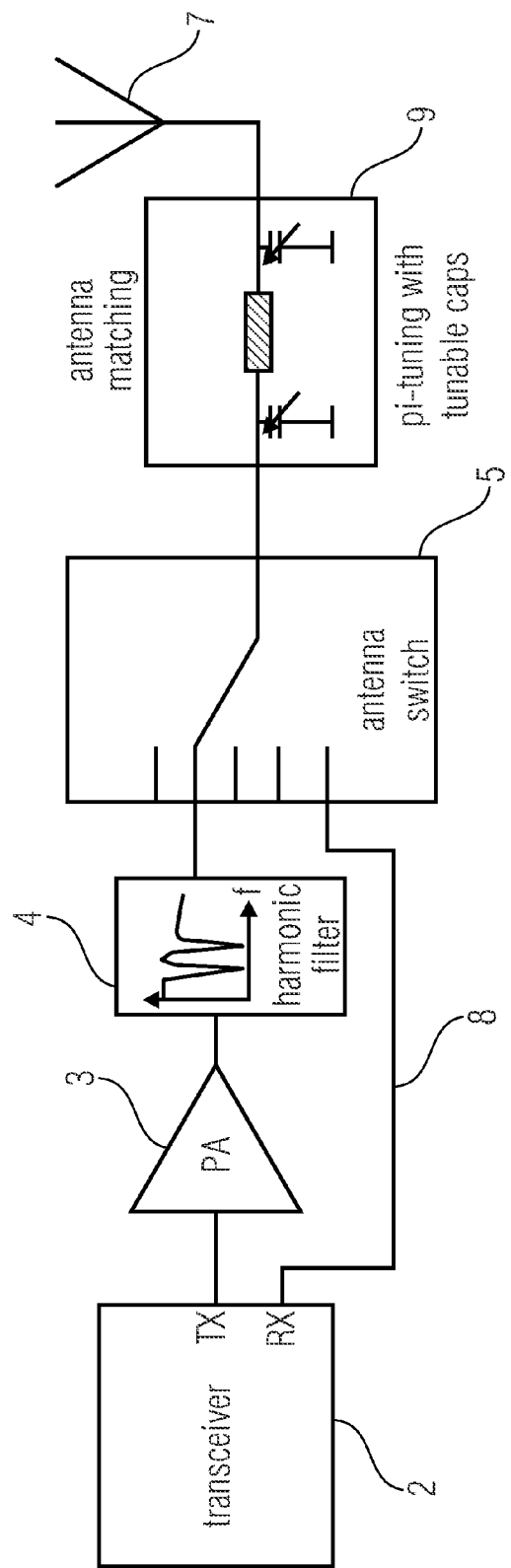
FIG. 3 shows a schematic block diagram of an RF or HF front end system according to the state of the art comprising a tunable Pi-network for antenna matching.

FIG. 3 illustrates a schematic block diagram of an HF front end system comprising an adjustable antenna matching network 9. The adjustable antenna matching network 9 is in the example illustrated in FIG. 3 configured as a Pi-network with tunable capacitances connected in parallel to the input and the output, respectively.

Figure 4:
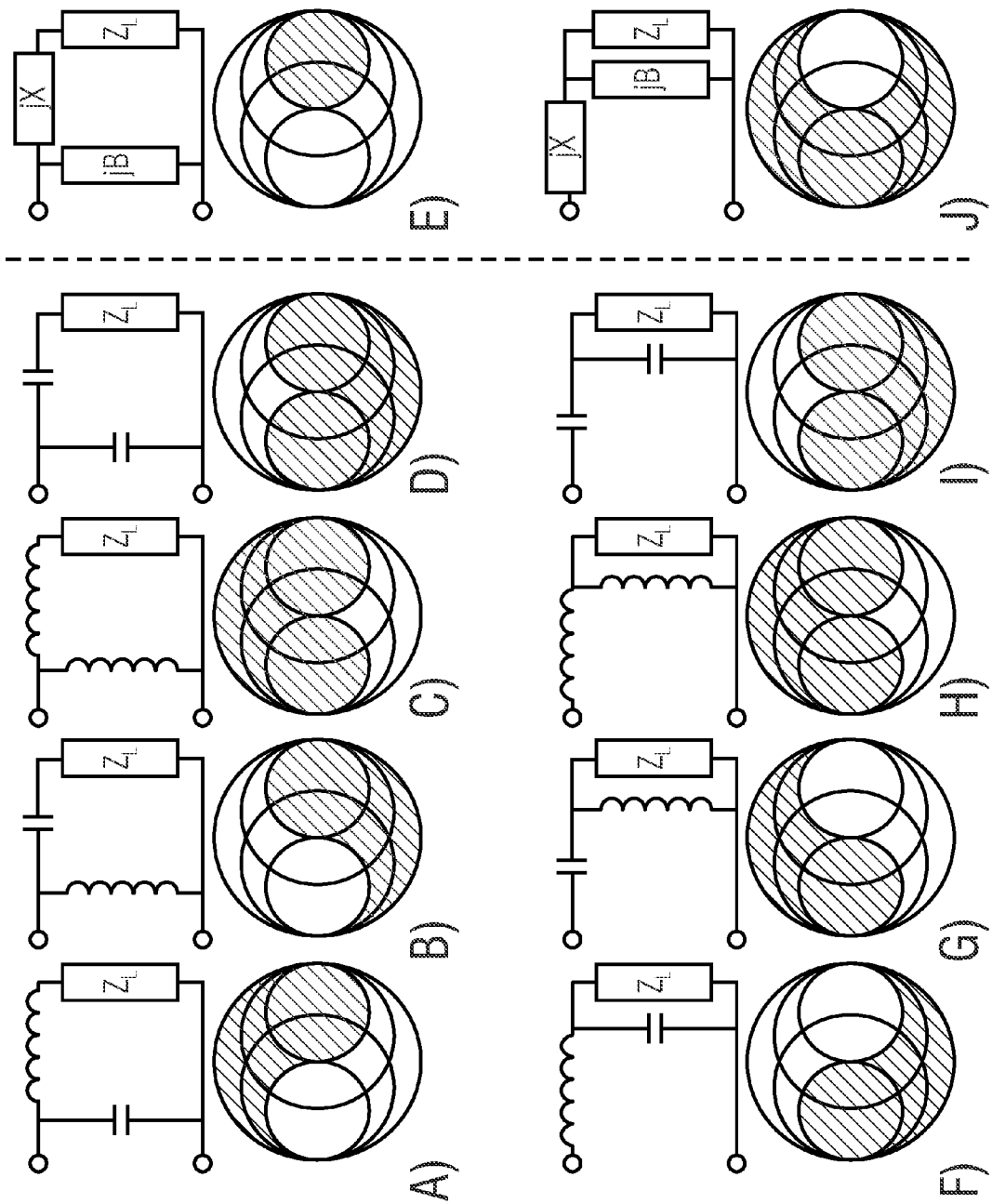
FIG. 4 illustrates a plurality of basic LC networks and their corresponding "forbidden regions" in the Smith chart plane.

With respect to the impedance matching network, it has to be considered that with a given impedance matching network topology not every impedance may be realized, i.e., there are so called "forbidden regions". FIG. 4 illustrates some basic LC networks and below each basic LC network a corresponding schematic Smith diagram in which the forbidden region is represented as a hatched region. A load impedance $Z_L$ is connected to the various LC basic networks.

Figure 5:
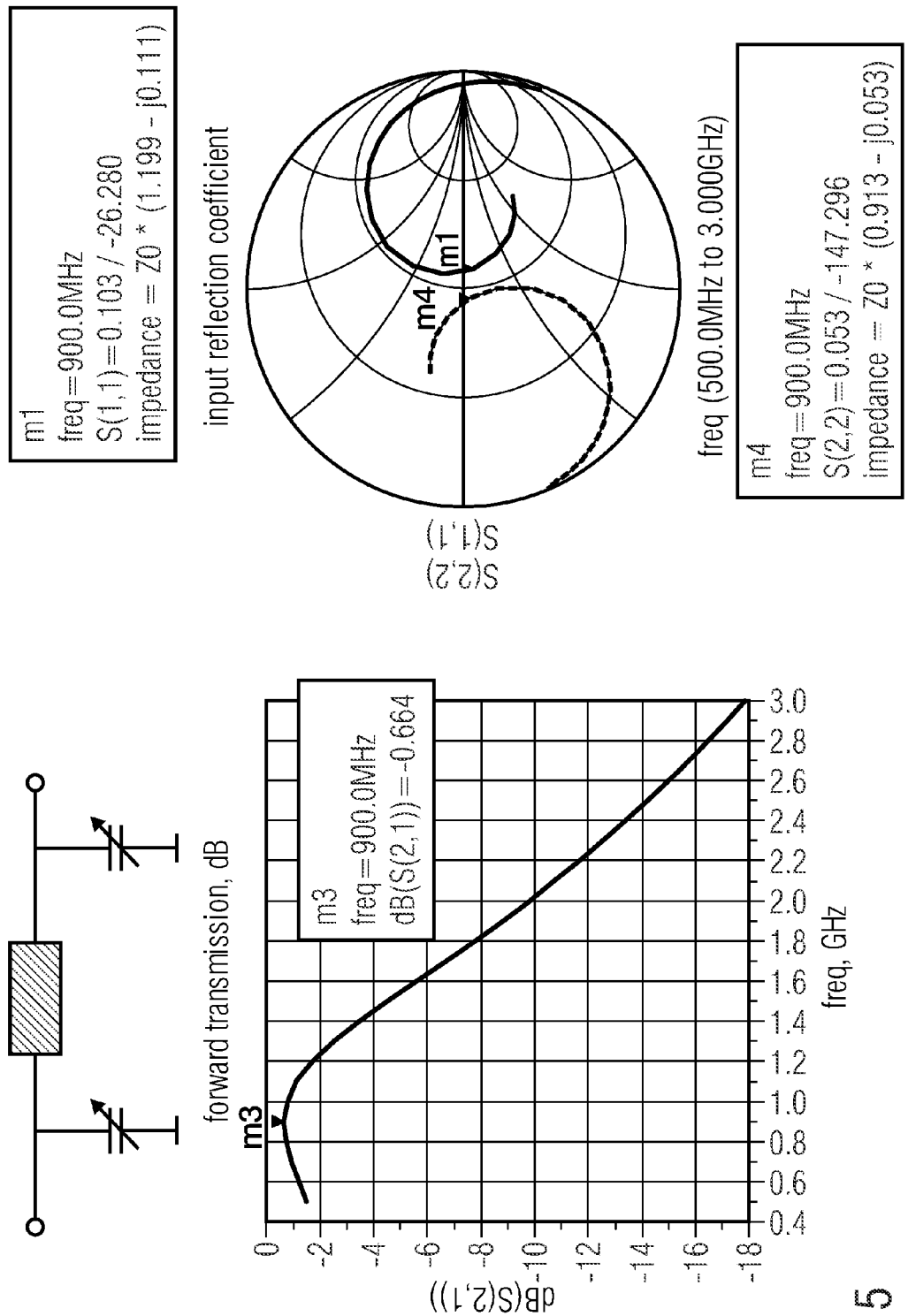
FIG. 5 shows a tunable Pi-network, a graph illustrating the forward transmission of the Pi-network over frequency, and a Smith chart illustrating the input and output reflection coefficients as a function of frequency.

In order to cover a wide range of possible impedances, adjustable impedance matching networks typically have a Pi-topology (Π-topology) or a T-topology. A Pi-topology having a series inductance, a parallel input capacitance, and a parallel output capacitance forms of low pass filter which attenuates harmonics generation. Furthermore, variable capacitances are available (rotary capacitor, BSR capacity (i.e., (Ba,Sr)RuO3) capacity) . . . ), whereas a variable inductance typically requires a variable tap. FIG. 5 schematically illustrates a Pi-topology of an adjustable impedance matching network, a diagram of the forward transmission over frequency, and a Smith chart of the input reflection coefficient $S(1,1)$ and the output reflection coefficient $S(2,2)$ as a function of the frequency.

Figure 6:
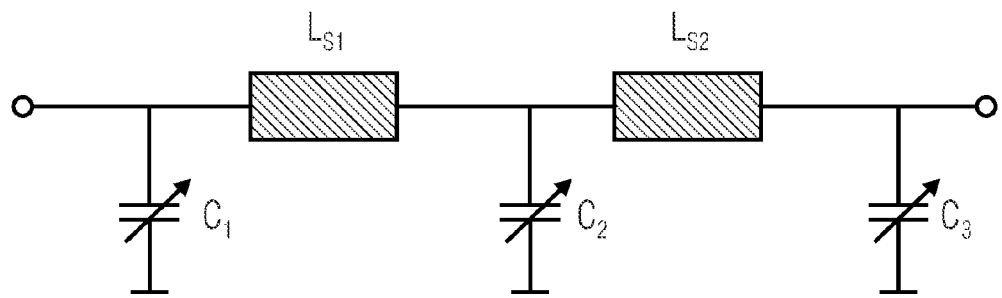
FIG. 6 shows a circuit schematic of a multistage matching network according to the state of the art.

The problem of the Pi-structure is that typically only the capacitances are varied, whereas the inductance is constant and is required to have a high figure of merit or quality factor. In the case in which no matching has to be performed, that is 50 ohms are matched to 50 ohms, the circuit functions as a pure phase shifter. As can be seen when examining the circuit illustrated in FIG. 5, losses occur in this situation, i.e., it would be desirable to bridge the inductance. Furthermore, the topology illustrated in FIG. 5 forms of narrowband system of first order, i.e., a good matching can be achieved in a very small frequency range, only, or, alternatively, in a broader frequency range by accepting inferior figures of merit/quality factors, resulting in higher losses. For this reason, broadband solutions requiring as few components as possible would be desirable. This basically means that a multistage matching structure is chosen, as shown in FIG. 6, which obviously leads to several matching elements, or that a transformer is used. Particularly for impedance transformations in the real plane so-called Guanella or Ruthroff transformers are known in the literature. While these historically were implemented as macroscopic transformers with bifilar windings, they may also be realized as planar transformers on or within a printed circuit board, a silicon substrate, or a laminated structure.

Figure 7:
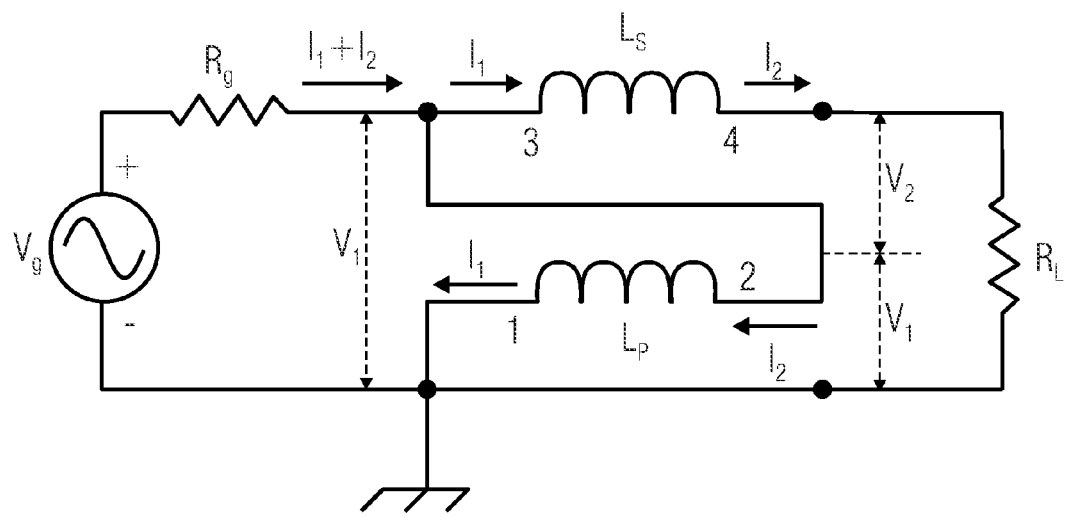
FIG. 7 shows a circuit schematic of a Ruthroff transformer connected to a voltage source, a source impedance, and a load impedance.

As an example, FIG. 7 shows a circuit schematic of a Ruthroff transformer functioning as a 1:4 impedance transformer which is assumed to have two identical inductances. The basic idea of these transformers is the combination of signal portions in an additive manner. In the case illustrated in FIG. 7 the output voltage is a sum of the voltage V2 across the series inductance and of the voltage V1 across the ground path. At the same time, the electric current is split up over the two inductances so that, due to a doubling of voltage and a halving of the electric current, an impedance transformation of 1:4 is achieved ($R_L$ appears to be more high-ohmic to the voltage source $V_g$).

The solution using a transformer typically has the following characteristics in comparison to, for example, a solution using a (classical) Pi-structure. For the sake of comparison, the same degree of matching is desired, namely matching of 12.5 ohms to 50 ohms. The target frequency is 900 MHz. The Pi-structure is illustrated in FIG. 5. The series inductance of the Pi-structure is 4 nH with a series resistance of 2 ohms. The left diagram illustrates the insertion loss $S(2,1)$, and the Smith chart to the right illustrates the input reflection coefficient $S(1,1)$ as a full stroke line, and the output reflection coefficient $S(2,2)$ as a dashed line.

Figure 8B:
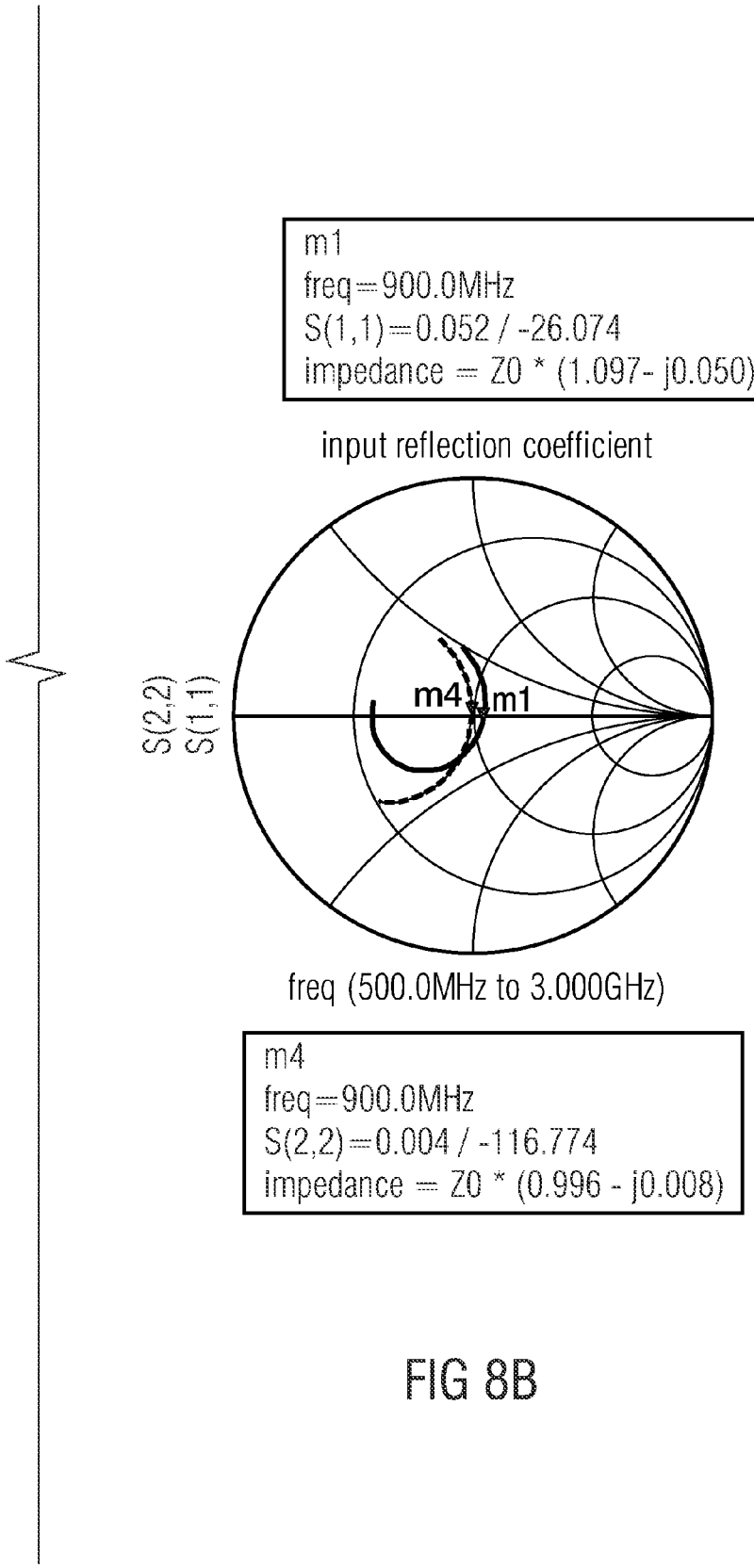
FIG. 8b shows a Smith chart illustrating the input and output reflection coefficients of the Pi-network as a function of frequency.

FIG. 8 shows a 4:1 Ruthroff transformer structure, a diagram of the forward transmission coefficient as a function of frequency, and a Smith chart of the input reflection coefficient $S(1,1)$ and the output reflection coefficient $S(2,2)$. The series inductance between the nodes 3 and 4 is $L_S=4$ nH and has a series resistance of 2 ohms. The inductance in the path to ground is substantially equal, i.e., $L_P=4$ nH with a series resistance of 2 ohms. The parallel input capacitance is Cs1=3.4 pF and the parallel output capacitance is Cs2=2 pF. The magnetic coupling factor between the series inductance and of the ground path inductance is k=0.8. Again, a small signal simulation (S parameters) has been performed and shows the behavior illustrated in the diagrams of FIG. 8. As can be seen in the left diagram of FIG. 8 illustrating the forward transmission factor as a function of the frequency, a smaller insertion loss can be achieved using an identical series inductance having an identical figure of merit/quality factor. In particular, the Pi-structure shown in FIG. 5 produced an instruction loss of approximately 0.66 dB, whereas the impedance matching network using a Ruthroff transformer illustrated in FIG. 8 has an insertion loss of only 0.49 dB. This is a difference of 0.15 dB, even though an additional second inductance having the same figure of merit/quality factor is involved.

The comparison of the input reflection coefficients $S(1,1)$ and of the $S(2,1)$ curve of the Pi-structure shown in FIG. 5 with the same curves of the Ruthroff transformer structure shown in FIG. 8 further reveals that the transformer solution also offers an improved bandwidth behavior, in particular a broader bandwidth. While the Pi-network has an attenuation of already 18 dB at 3 GHz (see forward transmission factor diagram in FIG. 5), an attenuation of only 2 dB can be achieved using the transformer-implemented impedance matching network as illustrated in FIG. 8. This is of particular interest with respect to production tolerances, because narrowband systems might lead to yield problems.

Figure 9:
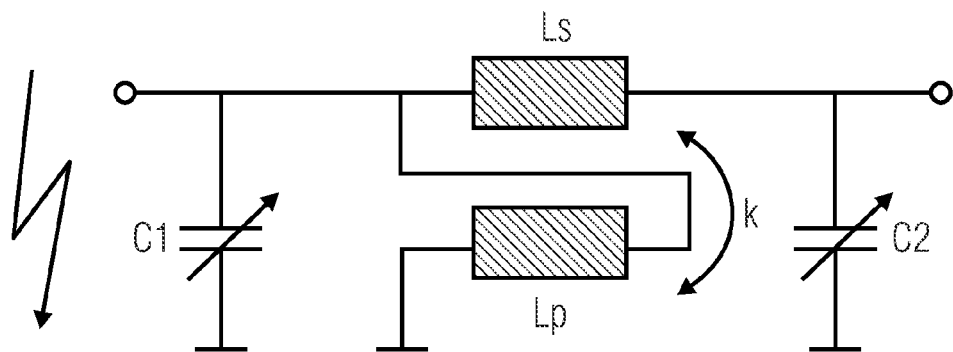
FIG. 9 illustrates a main electrostatic (overcurrent) discharge path within a Pi-network comprising a Ruthroff transformer.

The transformer structure shown in FIG. 8 further provides an additional electrostatic discharge (ESD) protection, as illustrated in FIG. 9. While sensible capacitances of the Pi-structure have to sustain an ESD pulse primarily on their own (which typically is not possible, or at least difficult to implement, using silicon-based integrated circuit), the capacitance within the transformer-implemented structure is protected by the inductance L. The discharge current path is indicated in FIG. 9 as a thick line. Another feature of the transformer-implemented impedance matching network that is of interest for adaptive matching, will be described below in more detail: by nature, the voltages split up over the two inductances.

Figure 10:
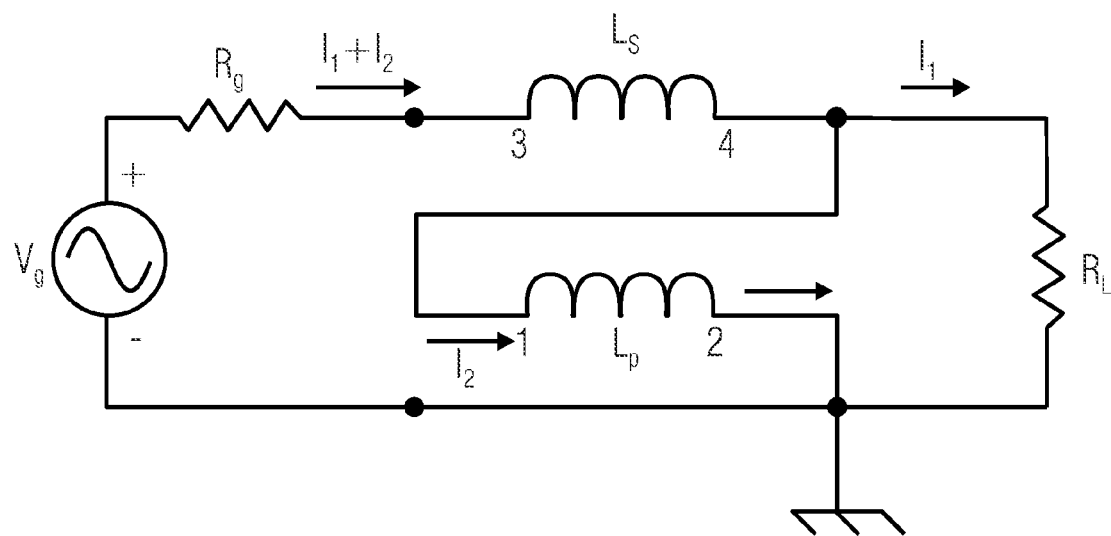
FIG. 10 shows a circuit schematic of a Ruthroff transformer in a second configuration.

By choosing different inductances for the series inductance $L_s$ and the ground path inductance $L_P$, transformation factors other than 1:4 may be implemented. Furthermore, it is possible to invert one of the inductances in order to convert the 1:4 transformer into a 4:1 transformer. In the circuit schematic shown in FIG. 10 the ground path inductance $L_P$ is inverted in comparison to the configuration of the Ruthroff transformer shown in FIG. 7, because node 1 of the ground path inductance $L_P$ is now connected to node 4 of the series inductance $L_S$, while node 2 of the ground path inductance $L_P$ is connected to the ground potential. The connection of the series inductance $L_S$ is the same in FIG. 7 and in FIG. 10.

Figure 11:
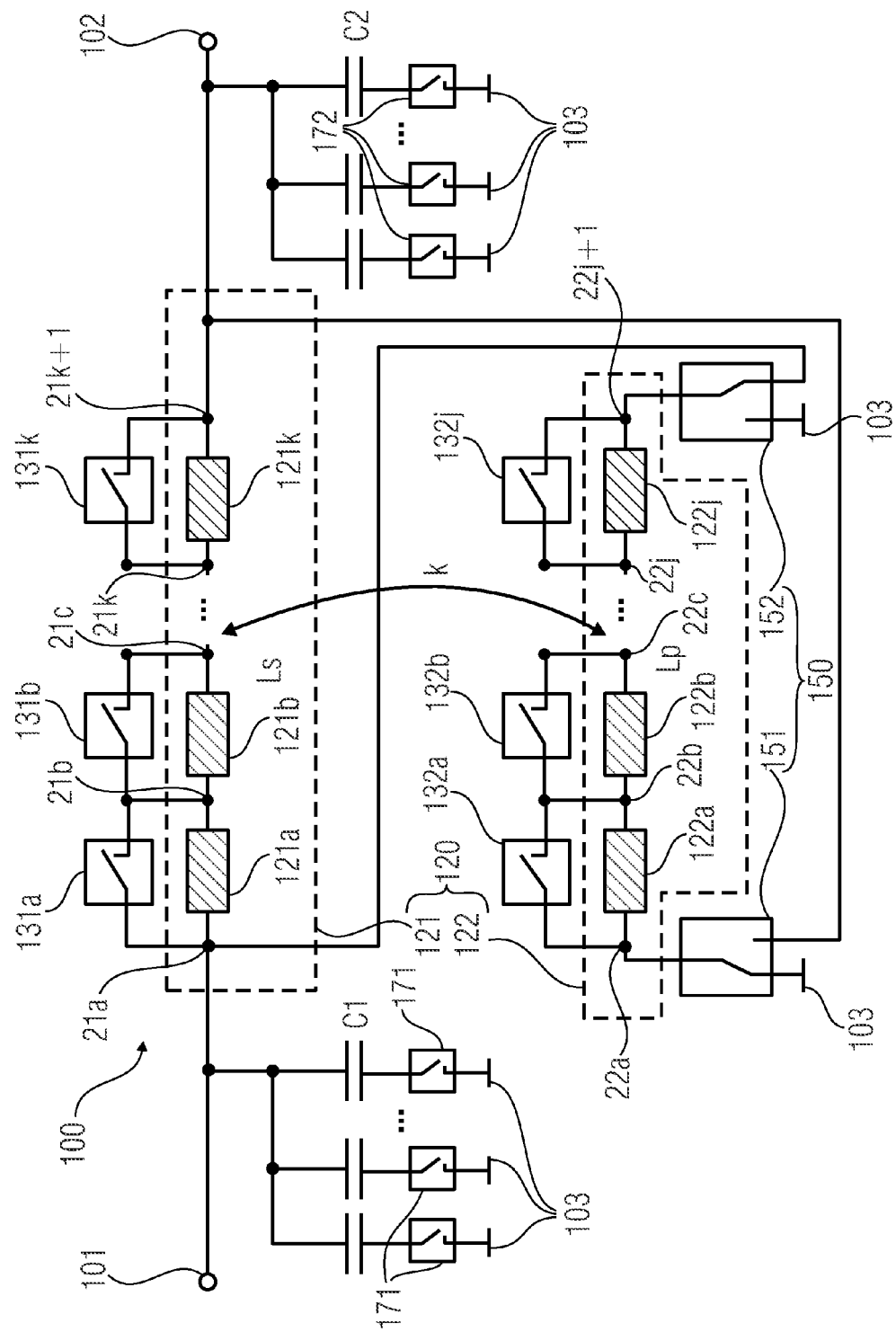
FIG. 11 shows a circuit schematic of an adjustable impedance matching network according to at least some embodiments of the teachings disclosed therein.

In order to obtain an adjustable impedance transformation, it is now possible to either switch the series inductance $L_S$ or the ground path inductance L. Reactive components, such as inductive or capacitive components, may then be adjusted as in the original approach using variable capacitances C1 and C2, as illustrated in FIG. 11. In particular, FIG. 11 shows a circuit schematic of an adjustable impedance matching network 100 according to at least one embodiment of the teachings disclosed herein.

The adjustable impedance matching network 100 shown in FIG. 11 comprises a first terminal 101, a second terminal 102, and a reference potential terminal 103. In the embodiment shown in FIG. 11 the reference potential corresponds to a ground potential for the circuit 100. The circuit 100 may be connected to the reference potential at a plurality of locations via a plurality of reference potential terminals 103. An impedance $Z_L$ or $R_L$ (see for example FIG. 4, 7, 8, or 10) that is to be matched to the input impedance or the output impedance of another circuit (e.g., the output impedance of a power amplifier 3 as illustrated in FIG. 3) may be connected to the first terminal 101 or the second terminal 102. The other circuit is then connected to the second terminal 102 or the first terminal 101, respectively.

The adjustable impedance matching network 100 further comprises a transmission line transformer 120. The transmission line transformer 120 comprises a series inductance (first inductor path) 121 and a ground path inductance (second inductor path) 122 which are magnetically coupled (coupling coefficient k). The first and second inductor paths 121, 122 are indicated by dashed boxes in FIG. 11. The series inductance 121 forms (or is part of) a first inductor path of the transmission line transformer 120. The ground path inductance 122 forms (or is part of) a second inductor path of the transmission line transformer 120. The transmission line transformer 120 is connected as a Ruthroff transformer in the embodiment shown in FIG. 11. In alternative embodiments the transmission line transformer could be connected as a Guanella transformer. The first inductor path 121 is connected to the first terminal 101 at one of its ends and to the second terminal 102 at its other end. The ground path inductance or second inductor path 122 is conductively couplable between the first input terminal 101 and the reference potential terminal 103, as will be described in more detail below. In an alternative embodiment, the first inductor path 121 could be conductively couplable between the first terminal 101 and the second terminal 102 in a reconfigurable manner, as well. In particular, the first inductor path 121 could be connected with reversed polarity. Note that the polarity of the first inductor path 101 and the second inductor path 102 has to be considered, due to the magnetic coupling of the first and second inductor paths 101, 102. This means that the transmission line transformer 120 exhibits different behaviors when one of the first and second inductor paths 101, 102 is connected with reversed polarity.

The series inductance 121 comprises a plurality of sub-sections 121a, 121b, . . . 121k. Each sub-section of the plurality of sub-sections 121a . . . 121k extends between two inductor nodes of a plurality of inductor nodes 21a, 21b, . . . 21k, 21k+1. The second inductor path 122 also comprises a plurality of sub-sections 122a, 122b, . . . 122j. Each sub-section of the plurality of sub-sections 122a . . . 122j extends between two inductor nodes of a plurality of inductor nodes 22a, 22b, . . . 22j, 22j+1. The number of sub-sections of the first inductor path 121 may be equal to the number of sub-sections of the second inductor path 121, i.e., j=k. According to some embodiments however, the first and second inductor paths 121, 122 may have different numbers of sub-sections, i.e., j≠k.

The adjustable impedance matching network 100 also comprises a plurality of switching elements 131a, 131b, . . . 131k. The switching elements 131a . . . 131k are connected in a series connection. Each switching element 131a . . . 131k may be a semiconductor switching element. Each switching element 131a . . . 131k is connected in parallel to one of the sub-sections 121a . . . 121k of the first inductor path 121. Each of the plurality of switching elements 131a . . . 131k may bridge the corresponding sub-section 121a . . . 121k of the first inductor path 121 when the switching element is controlled to be in a conducting state by means of a suitable control signal. It is also possible to bridge several sub-sections of the first inductor path 121 by controlling several of the switching elements 131a . . . 131k to be conducting. In particular, the entire first inductor path 121 may be bridged when all of the switching elements 131a . . . 131k are (temporarily) conducting so that the first terminal 101 and the second terminal 102 are connected via the semiconductor switching element(s) 131a . . . 131k.

In a similar manner, a second plurality of switching elements 132a, 132b, . . . 132j is provided in order to selectively bridge one or more of the sub-sections 122a . . . 122j of the second inductor path 122, in response to corresponding control signals applied to the switching elements 132a . . . 132j. Each switching element 132a . . . 132j may be a semiconductor switching element. Each switching element 132a . . . 132j is connected in parallel to one of the sub-sections 122a . . . 122j of the second inductor path 122. Each of the plurality of switching elements 132a . . . 132j may bridge the corresponding sub-section 122a . . . 122j of the second inductor path 122 when the switching element is controlled to be in a conducting state by means of a suitable control signal.

The first plurality of switching elements and/or the second plurality of switching elements may form a selector switch configured to selectively connect one of the plurality of inductor nodes 21a, . . . 21k+1, 22a, . . . 22j+1 of the first inductor path 121 or the second inductor path 122 to the first terminal 101, the second terminal 102, or both the first and second terminals 101, 102.

The adjustable impedance matching network 100 shown in FIG. 11 further comprises a reconfiguration unit 150 that may be used to configure the adjustable impedance matching network 100 in at least two different configurations. In a first possible configuration a first end (coinciding with inductor node 22j+1 in the embodiment shown in FIG. 11) of the second inductor path 122 is connected to the first terminal 101, and a second end (coinciding with inductor node 22a) of the second inductor path 122 is connected to the reference potential terminal 103. In a second possible configuration the first end (i.e., inductor node 22j+1) of the second inductor path 122 is connected to the reference potential terminal 103 and the second end (i.e., inductor node 22a) of the second inductor path 122 is connected to the first terminal 101. Thus, in the first configuration the transmission line transformer 120 is connected as a Ruthroff transformer according to FIG. 7. In the second configuration the transmission line transformer 120 is connected as a Ruthroff transformer according to FIG. 10. As explained in connection with FIG. 10, the impedance transformation ratio can be changed, for example, from a 1:4 impedance transformation ratio to a 4:1 impedance transformation ratio, by changing from the first configuration to the second configuration.

The reconfiguration unit 150 comprises a first changeover switch 152 and a second changeover switch 151. The first changeover switch 152 is connected to the first inductor node 22*j*+1 at its common terminal, to the reference potential terminal 103 at one of its two other terminals, and to the first terminal 101 at the remaining terminal. The second switchover switch 151 is connected to the second end (inductor node 22*a*) of the second inductor path 122, to the reference potential terminal 103 at one of its other terminals, and to the first terminal 101 at the remaining terminal.

The reconfiguration unit 150 may also be regarded or used as a pole reversal element that is configured to reverse a polarity of the first inductor path 121 or the second inductor path 122. When used as a pole reversal element for the first inductor path 121, the common terminals of the two changeover switches 151, 152 would be connected to the first inductor node 21*a* and the second inductor node 21*k*+1 of the first inductor path 121. The other terminals of the two changeover switches 151, 152 would then be connected to the first terminal 101 and the second terminal 102.

The adjustable impedance matching network 100 of FIG. 11 also comprises a first terminal impedance C1 and a second terminal impedance C2. The first terminal impedance C1 and the second terminal impedance C2 are substantially capacitive. The first terminal impedance C1 comprises a bank of parallel, individually switchable capacitors and a plurality of further (semiconductor) switching elements 171. Therefore, the first terminal impedance C1 is variable. The first terminal impedance C1 is connected in parallel to the remainder of the adjustable impedance matching network 100 between the first terminal 101 and the reference potential terminal 103. The second terminal impedance C2 is similar to the first terminal impedance C1. In particular, the second terminal impedance C2 is variable by means of a plurality of further (semiconductor) switching elements 172.

The adjustable impedance matching network 100 forms a Pi-network with the first terminal impedance C1 and the second terminal impedance C2 being the parallel impedances. The first inductor path 121 of the Ruthroff transformer 120 forms a series impedance or series element of the Pi-network.

The transmission line transformer 120 may be a classical transformer, a bifilar transformer or a planar transformer. In the case of a planar transformer it may be implemented as a printed circuit board integrated transformer, semiconductor transformer, redistribution layer technologies (EWLB—Embedded Wafer Level Ball Grid Array) or a combination thereof.

Note that an adjustable impedance matching network according to the teachings disclosed herein may comprise, in a basic configuration, only the following elements: the first terminal 101, the second terminal 102, the reference potential terminal 103, the transmission line transformer 120, and one semiconductor switching element (e.g., the switching element 131*a*).

Figure 12:
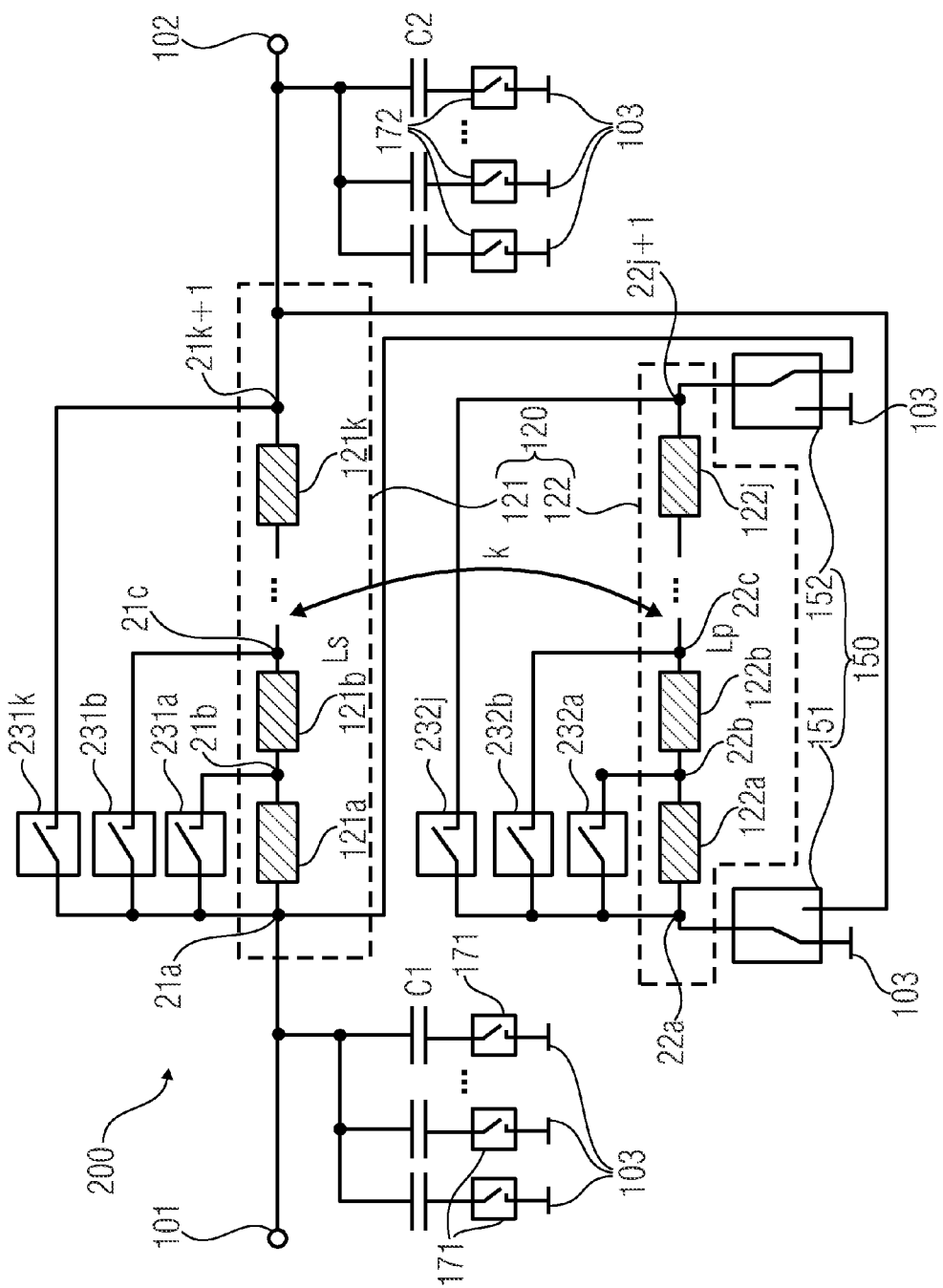
FIG. 12 shows a circuit schematic of an adjustable impedance matching network according to at least some embodiments of the teachings disclosed herein.

FIG. 12 shows in a schematic manner a circuit diagram of a further embodiment of an adjustable impedance matching network 200 according to the teachings disclosed herein. The difference between the adjustable impedance matching network 100 of FIG. 11 and the adjustable impedance matching network 200 of FIG. 12 is that the switching elements for adjusting an inductance of the first inductor path 121 or the second inductor path 122 are connected in a different manner. The adjustable impedance matching network 200 of FIG. 12 comprises a plurality of (semiconductor) switching elements 231*a*, 231*b*, . . . 231*k* for the first inductor path 121. Furthermore, the adjustable impedance matching network 200 comprises a plurality of (semiconductor) switching elements 232*a*, 232*b*, . . . 232*j* for the second inductor path 122. The switching element 231*a* is connected in parallel to the first sub-section 121*a* of the first inductor path 121. The switching element 231*b* is connected in parallel to a series connection of the first and second sub-sections 121*a*, 121*b* of the first inductor path 121. The switching element 231*k* is connected in parallel to the entire first inductor path 121, i.e., a series connection of all sub-sections 121*a* . . . 121*k*. Regarding the second inductor path 122, the switching elements 122*a* . . . 122*j* are connected in a similar manner with respect to the sub-sections 122*a* . . . 122*j* of the second inductor path 122.

In the adjustable impedance matching network 200 of FIG. 12, at most one conducting switching element 231*a* . . . 231*k* connects the first terminal 101 and the second terminal 102. Accordingly, a relatively low voltage drop can be achieved which is beneficial for the insertion loss of the impedance matching network 200. On the other hand, especially the switching elements 231*k* and 232*j* which are connected in parallel to the entire first inductor path 121 or the entire second inductor path 122, respectively, have to sustain relatively high voltages when being in the non-conductive state (regarding the topic of the voltage rating of the switching elements, also see FIG. 19 and the corresponding description).

Figure 13:
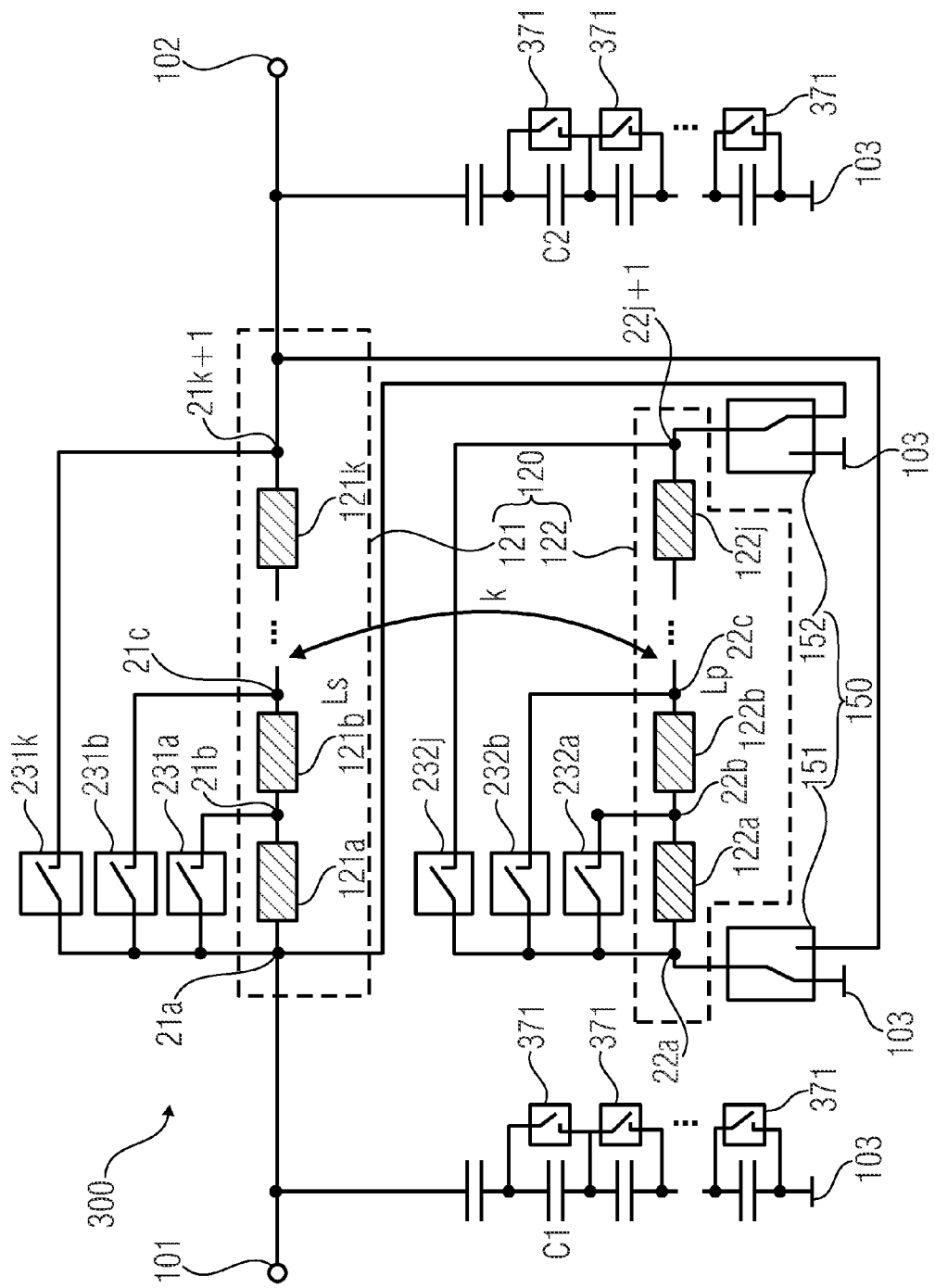
FIG. 13 shows a circuit schematic of an adjustable impedance matching network according to at least some further embodiments of the teachings disclosed therein.

FIG. 13 shows an embodiment of the adjustable impedance matching network 300 in which the first and second terminal impedances C1, C2 comprise series connections of capacitors instead of parallel connections as in FIGS. 11 and 12. Individual ones of the series connected capacitors are bridgeable by means of further (semiconductor) switching elements 371 (for the first terminal impedance) or 372 (for the second terminal impedance). Other than the different configurations of the first and second terminal impedances the adjustable impedance matching network 300 is identical to the adjustable impedance matching network 200 illustrated in FIG. 12.

The basic idea of the disclosed teachings is not to employ known T-networks or Pi-networks, but to use a transformer instead and to implement its transformation ratio in at least one sub-section of its winding. Thus, a number of benefits can be achieved:

Lower losses/insertion loss when using equivalent components;

Larger bandwidth and thus less sensibility to production tolerances;

Usable for several frequency bands; a transformer can handle the 900 MHz band as well as the 1.8 GHz band, whereas a Pi-structure according to FIG. 5 would require two different inductivities (which may be achieved using a switch, but this would require an additional switch and thus leads to additional losses);

A ground connection is always provided via the second inductor path so that the capacitances (if present) are better protected against electrostatic discharge (ESD);

As the switching elements (e.g. switching transistors) only see a small portion of the voltage swing, devices having a lower breakdown voltage may be used: devices with smaller on-resistance $R_{on}$ and/or off-capacitance $C_{off}$ may be used.

Figure 14:
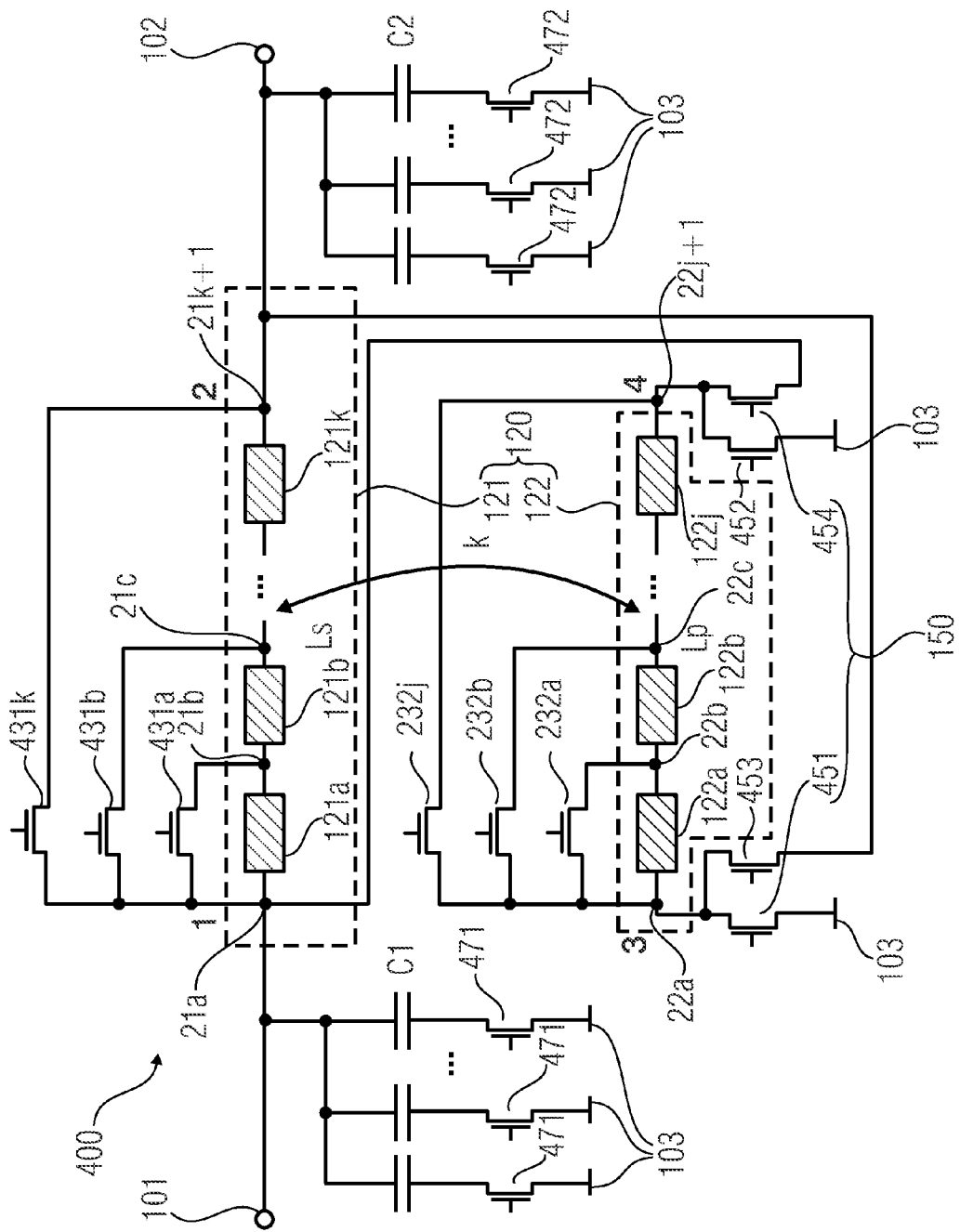
FIG. 14 shows a circuit schematic of an adjustable impedance matching network according to at least some more embodiments of the teachings disclosed therein.

FIG. 14 shows an adjustable impedance matching network 400 similar to the adjustable impedance matching network 200 of FIG. 12. In the adjustable impedance matching network 400 the switching elements are implemented as NMOS (n-channel metal oxide semiconductor) transistors 431*a*, 431*b*, . . . 431*k* and 432*a*, 432*b*, . . . 432*j*. The NMOS transistors may be part of a CMOS circuit and may be produced by means of a CMOS process. Also the switching elements for varying the first terminal impedance and the switching elements for varying the second terminal impedance are implemented as NMOS transistors 471, 472 in the embodiment shown in FIG. 14. Furthermore, the reconfiguration unit 150 comprises NMOS transistors 451, 452, 453, and 454. The transistors 451 and 453 provide the functionality of the changeover switch 151 depicted in FIGS. 11 to 13. The transistors 452 and 454 provide the functionality of the changeover switch 152 depicted in FIGS. 11 to 13. The transistors 451 and 452 are connected to the inductor node 22*a* of the second inductor 122, and, at their respective opposite sides, to the reference potential and the second terminal 102, respectively. The transistors 453 and 454 are connected to the inductor node 22*j*+1 of the second inductor 122, and, at their respective opposite sides, to the reference potential and the first terminal 101, respectively.

Regarding the embodiments shown in FIGS. 11 to 14, some observations can be made. However, these may be circumvented as will be explained below.

In the embodiments shown in FIGS. 11 to 14 the second inductor path 122 (Lp) needs to have a large inductivity for large impedances. This is, for example, necessary when for "low" frequencies no additional losses can be tolerated. As a rule of thumb the inductivity of the second inductor path 122 should not be smaller than 18 nH for frequencies around 800 MHz.

Another observation that can be made is that, at low impedances, the (resistive) series portion of the inductivity and of the switch transistor increasingly take effect. This means that it may be beneficial to dimension the first inductor path 121 (Ls) somewhat larger than the second inductor path 122 (Lp). Moreover, a switching transistor should not be chosen "narrow" (i.e., the (channel) width in the case of a MOS transistor, or the effective emitter area in the case of bipolar transistor).

Figure 15:
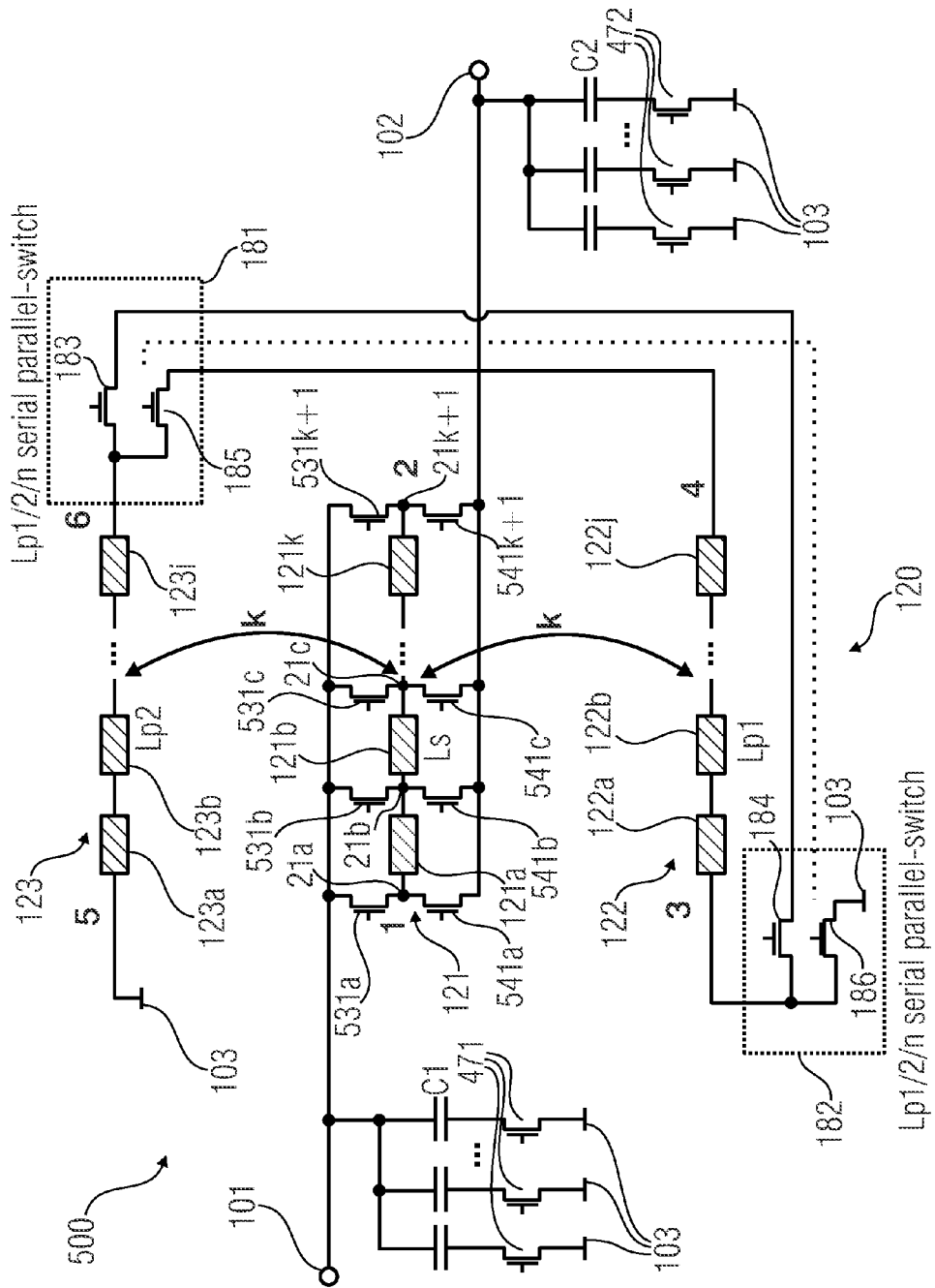
FIG. 15 shows a circuit schematic of an adjustable impedance matching network according to at least some further embodiments of the teachings disclosed therein.
Figure 16:
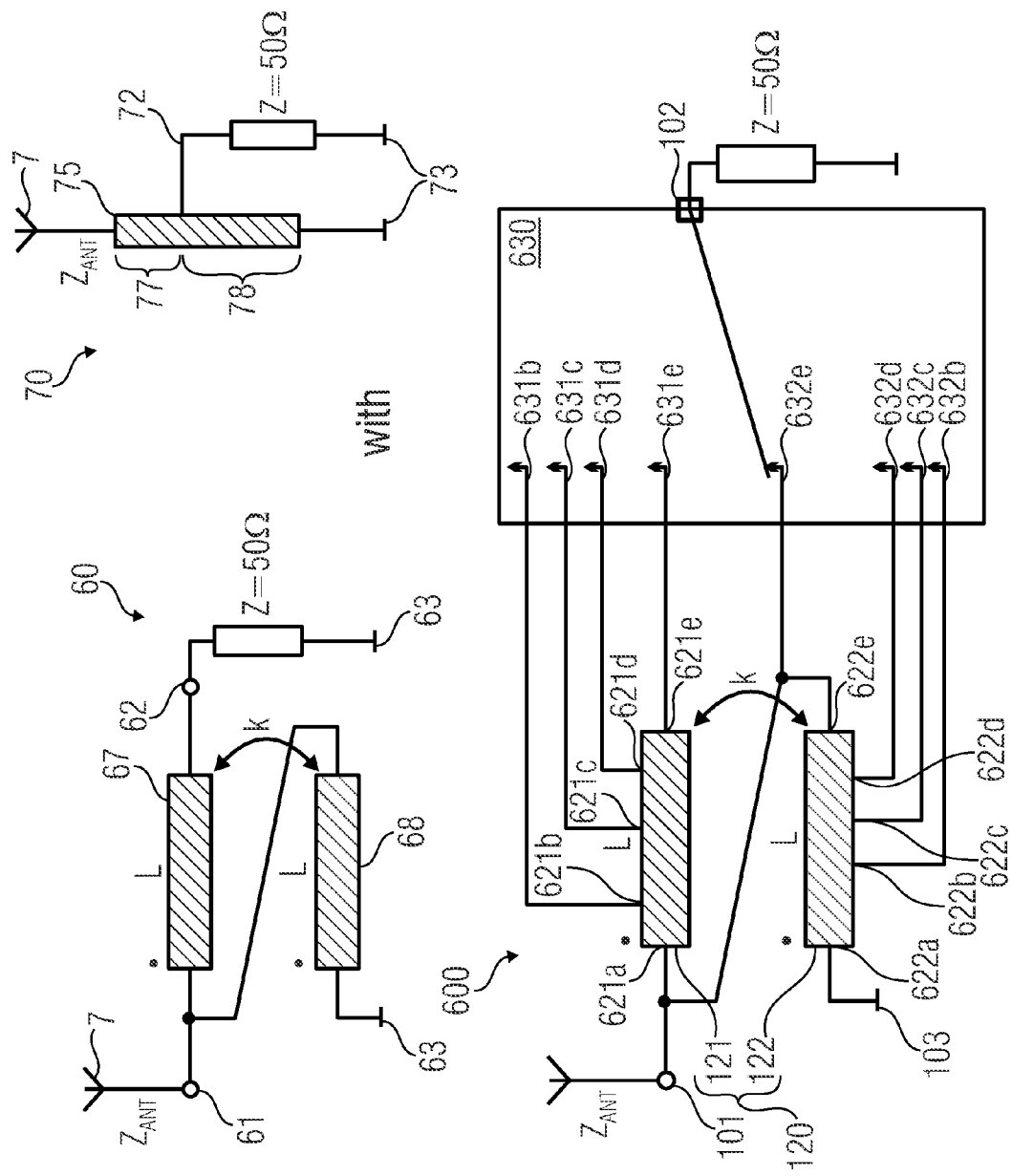
FIG. 16 illustrates a combination of a Ruthroff transformer and an auto transformer to arrive at an adjustable impedance matching network comprising a transmission line transformer according to at least some more embodiments of the teachings disclosed herein.

Two further variants suitable for implementation are shown in FIGS. 15 and 16.

FIG. 15 schematically shows a circuit diagram of an adjustable impedance matching network 500 according to a further embodiment of the teachings disclosed herein. The transmission line transformer comprises a first inductor path 121 (Ls), a second inductor path 122 (Lp1), and a third inductor path 123 (Lp2). The third inductor path 123 is magnetically coupled with the first inductor path 121 (coupling factor k). The third inductor path 123 comprises a plurality of sub-sections 123*a*, 123*b*, . . . 123*i*.

In other words, a structure with at least three windings is used. The first inductor path 121 (Ls) comprises a single winding, whereas the remainder of the transmission line transformer 120 is implemented using at least two windings 122, 123. By connecting the at least two windings 122, 123 in parallel or in series, the required inductance of 18 nH mentioned above and, conversely, a high transformation ratio for low frequencies can be achieved. In particular, the second inductor path 122 and the third inductor path 123 may be connected in series for high impedances, and in parallel for low impedances.

The first inductor path 121 is conductively couplable to the first terminal 101 by means of a plurality of switching elements 531*a*, 531*b*, 531*c*, . . . 531*k*+1. Moreover, the first inductor path 121 is conductively couplable to the second terminal 102 by means of a second plurality of switching elements 541*a*, 541*b*, 541*c*, . . . 541*k*+1. Each switching element of the first plurality of switching elements 531*a* . . . 531*k*+1 is configured to connect a corresponding inductor node 22*a*, . . . 22*k*+1 with the first terminal 101. In a similar manner, each switching element of the second plurality of switching elements 541*a* . . . 541*k*+1 is configured to connect the corresponding inductor node 22*a* . . . 22*k*+1 with the second terminal 102. In this manner, an electrical connection between the first terminal 101 and the second terminal 102 may comprise a variable number of the sub-sections 121*a* . . . 121*k*, i.e., from zero sub-sections to all k sub-sections. Furthermore, the sub-sections 121*a* . . . 121*k* may be different, e.g. they may have different numbers of windings and/or different amounts of magnetic coupling with the second inductor path 122 and/or the third inductor path 123, so that an even greater variety of different configurations can be obtained.

The adjustable impedance matching network 500 further comprises a parallel-serial connection unit. The parallel-serial connection unit comprises a first serial-parallel changeover switch 181 and a second serial-parallel changeover switch 182. The first serial-parallel changeover switch 181 comprises two NMOS transistors 183, 185. The second serial-parallel changeover switch 182 also comprises two NMOS transistors 184, 186. Alternatively, other switching elements than NMOS transistors could be provided. By means of the parallel-serial connection unit the second inductor path 122 and the third inductor path 123 may be selectively connected in a series connection and a parallel connection. The transformation ratio of the transmission line transformer changes depending on whether a series connection or a parallel connection of the second inductor path 122 and the third inductor path 123 is set. In order to obtain a series connection, the transistors 184 and 183 have to be in a conducting state and the transistors 185 and 186 have to be in a blocking state. In order to connect the second inductor path 122 and the third inductor path 123 in parallel, the transistors 185 and 186 have to be in the conducting state, and the transistors 184, 183 have to be in the blocking state. Note that one of the transistors 183 and 184 may be omitted because both transistors are in the same branch of the circuit, in which case one of the two changeover switches 181, 182 may be reduced to a simple switch. As can be seen in FIG. 15, the parallel-serial connection unit comprises a plurality of (semiconductor) switching elements 183, 184, 185, 186 for selectively connecting respective nodes of the second inductor path 122 and the third inductor path 123 to one of the first terminal 101, the second terminal 102, the reference potential terminal 103, and/or among each other.

By means of the switching elements 531*a* . . . 531*k* and 541*a* . . . 541*k* at the first inductor path 121, a large number of different impedances can be switched. Note that the transmission line transformer can also be reconfigured using the switching elements 531*a* . . . 531*k* and 541*a* . . . 541*k*. In particular, a polarity of the first inductor path 121 may be reversed (for example, when the switching elements 531*k* and 541*a* are in their respective conducting states). Thus, the switching elements 531*a* . . . 531*k* and 541*a* . . . 541*k* may also act as the reconfiguration unit and/or the pole reversal element, as described above.

The adjustable impedance matching network 500 of FIG. 15 is basically well suited for implementation. However, a downside of this embodiment is that two switches are connected in a series arrangement in the main signal path. In other words, the cascaded arrangement of two switches leads to higher losses, compared to other solutions requiring a single switch, only. This characteristic has to be considered with respect to the fact that, at low impedances, the (resistive) series portion of the inductivity and switch transistor increasingly take effect. Thus, the arrangement shown in FIG. 15 results in a high series resistance which negatively affects the performance of the adjustable impedance switching network with respect to losses (in particular with respect to the insertion loss). An alternative embodiment that does not have a cascaded arrangement of two switches would comprise a similar layout structure for the transformer with the exception that the first inductor path 121 is "encircled" at both sides by the second and third inductor paths 122, 123. Such an alternative embodiment is shown in FIG. 16 which will be described below.

FIG. 16 shows a Ruthroff transformer 60, an autotransformer 70, and a combination of a Ruthroff transformer and an autotransformer to form an adjustable impedance matching network 600 according to the teachings disclosed herein. The combination may be implemented in one passive structure.

The Ruthroff transformer 60 is connected to the antenna 7 at its first terminal 61 and to a load impedance (Z=50 Ohm in the depicted example) at its second terminal 62. A reference potential terminal 63 of the Ruthroff transformer 60 is connected to ground (or corresponds to ground). The Ruthroff transformer 60 further comprises a first inductor path 67 and a second inductor path 68. The first inductor path 67 is connected between the first terminal 61 and the second terminal 62. The second inductor path 68 is connected between the first terminal 61 and the reference potential terminal 63. The first and second inductor paths 67, 68 are magnetically coupled via a coupling factor k.

The autotransformer 70 comprises a single inductor path 75 which is connected to the antenna 7 at one of its ends and to the reference potential terminal 73 (electrical ground potential) at its other end. The load impedance Z (again with Z=50 ohm, for the purposes of the depicted example) is connected to a tap 72 serving as the second terminal of the autotransformer 70. The tap 72 is connected to one of the windings of the inductor path 75 and thus divides the single inductor path 75 in a first portion 77 and second portion 78. Note that the impedance to be transformed may be connected to the first terminal 101 or to the second terminal 102.

The lower part of FIG. 16 shows the result of a combination of the Ruthroff transformer 60 and the autotransformer 70, namely the adjustable impedance matching network 600 according to at least one embodiment of the teachings disclosed herein. The adjustable impedance matching network 600 comprises a first inductor path 121 and a second inductor path 122. The first and second inductor paths 121, 122 are magnetically coupled (coupling factor k). The first inductor path 121 is connected between the first terminal 101 and a plurality of selector switch inputs 631$b$, 631$c$, 631$d$, 631$e$ of a selector switch 630. Each of the selector switch inputs 631$b$, 631$c$, 631$d$, 631$e$ is connected to a corresponding inductor node 621$b$, 621$c$, 621$d$, 621$e$ of the first inductor path 121. A common terminal of the selector switch 630 is connected to the second terminal 102 of the adjustable impedance matching network 600. The second inductor path 122 is connected between the first terminal 101 and the reference potential terminal 103. Furthermore, a plurality of taps are provided that connect windings of the second inductor path 122 with further input terminals 632$b$, 632$c$, 632$d$, 632$e$ of the selector switch 630. Each of the selector switch inputs 632$b$, 632$c$, 632$d$, 632$e$ is connected to a corresponding inductor node 622$b$, 622$c$, 622$d$, 622$e$ of the second inductor path 122. The inductor node 121$a$ of the first inductor path 121 is electrically connected to the inductor node 622$e$ of the second inductor path 122, i.e., the inductor nodes 121$a$ and 122$e$ may be regarded as having the same electrical potential.

The selector switch 630 is configured to electrically connect one of the inductor nodes 621$a$ . . . 621$e$ and 622$b$ . . . 622$e$ with the second terminal 102. The adjustable impedance matching network 600 substantially functions in a Ruthroff transformer mode when one of the inductor nodes 631$b$ . . . 631$e$ of the first inductor path 121 is connected to the second terminal 102. In contrast, the adjustable impedance matching network 600 substantially functions in an autotransformer mode when one of the inductor nodes 622$b$ . . . 622$d$ of the second inductor path 122 is connected to the second terminal 102.

In other words, the idea illustrated in FIG. 16 basically concerns a combination of an autotransformer and a Ruthroff transformer. The underlying idea of this embodiment is that for low impedances a structure is used as proposed herein, whereas for high impedances the structure is converted to an autotransformer. The autotransformer allows a simple transformation of high impedances to low impedances, whereas the opposite case requires very high coupling factors, which is difficult to realize in practice, especially as planar silicon. In comparison to the configuration shown in FIG. 15, the configuration shown in FIG. 16 only requires one switch in the main signal path, i.e., between the first terminal 101 and the second terminal 102, this switch actually corresponding to a normal antenna switch. Thus, the configuration of FIG. 16 can be expected to have a lower insertion loss than the configuration of FIG. 15.

The Ruthroff transformer configuration is well suited for low impedances. With an impedance transformation ratio of 1:4 an impedance range of, for example, 12.5 ohm to 50 ohm can be covered by the Ruthroff transformer configuration. The autotransformer, on the other hand, is well suited for high impedances. The losses are proportional to the matching ratio. To also cover lower impedances in the Ruthroff transformer mode (e.g., 1:8) the second inductor path 122 (or shunt) is also switchable by using several switchable windings. The several switchable windings may then be connected in series or in parallel, or some of the windings may be bypassed.

Figure 17A:
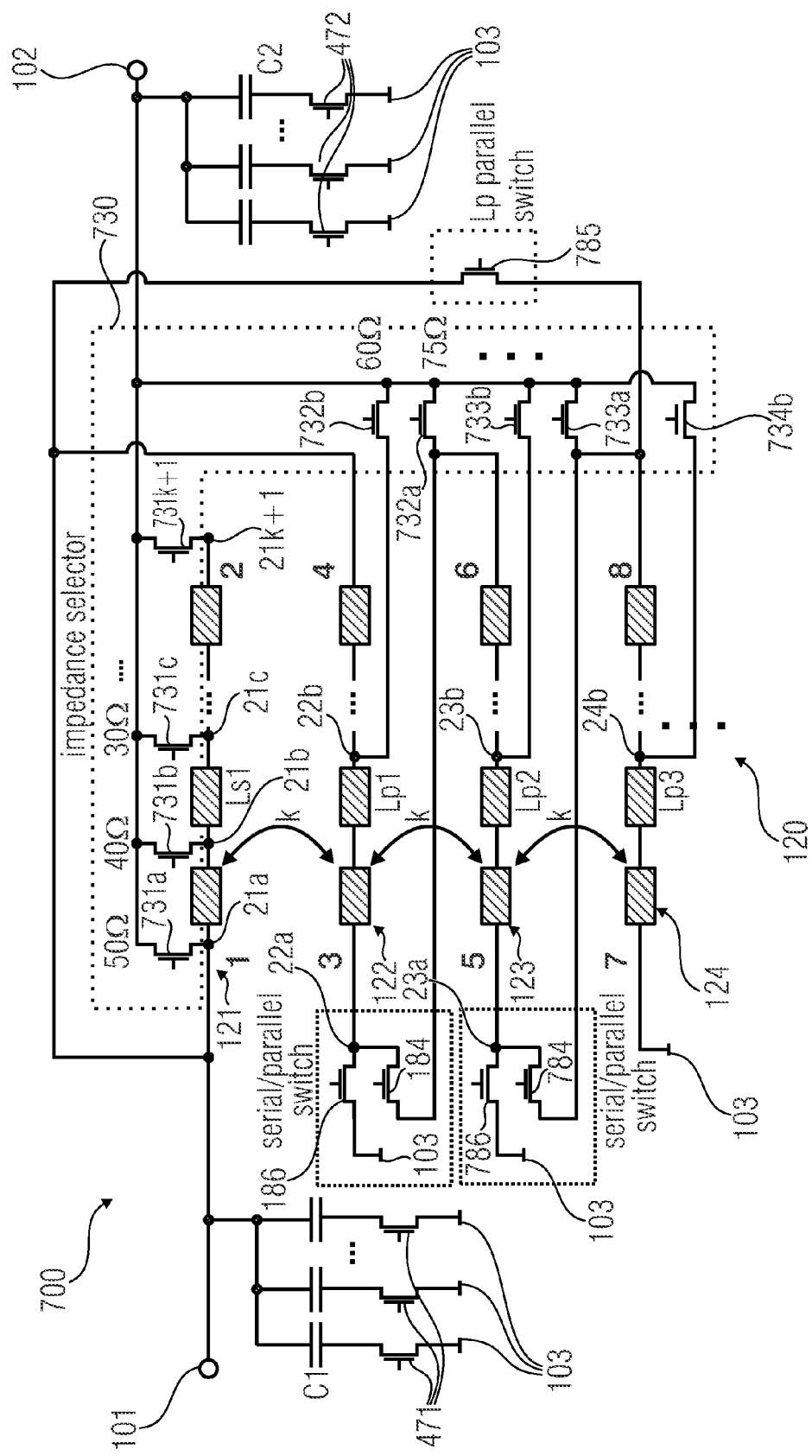
FIG. 17A shows a circuit schematic of an adjustable impedance matching network according to at least some further embodiments of the teachings disclosed herein having four windings.

FIGS. 17A to 17G show a further possible configuration of an adjustable impedance matching network 700 according to the teachings disclosed herein. FIG. 17A schematically illustrates the adjustable impedance matching network 700. The FIGS. 17B to 17G illustrate the main signal paths (or current paths) within the adjustable impedance matching networks 700 in different configurations that provide different impedance transformations. The main signal paths are represented by thick lines in FIGS. 17B to 17G. Note that in FIGS. 17B to 17G the first and second input impedances C1 and C2 are represented as being inactive, i.e., the switches 171, 172 are represented as being in their respective non-conducting states. Nevertheless, the switches 171, 172 may be in the conducting state or in the non-conducting state in an individual manner in the different configurations in FIGS. 17B to 17G, as required to obtain the desired impedance matching.

The adjustable impedance matching network 700 shown in FIG. 17A may be regarded as a more detailed view of the representation of the adjustable impedance matching network 600 shown in FIG. 16. In particular, the selector switch 630 in FIG. 16 is implemented in FIG. 17A as an impedance selector 730 comprising a plurality of switching elements 731$a$, 731$b$, 731$c$, . . . 731$k$+1, 732$a$, 732$b$, 733$a$, 733$b$, 734$b$. The transmission line transformer 120 comprises four inductor paths 121, 122, 123, and 124, i.e., two further inductor paths 123, 124 in addition to the first and second inductor paths 121, 122. The switching elements 731$a$, 731$b$, 731$c$ . . . 731$k$+1 are configured to connect the inductor nodes 21$a$, 21$b$, 21$c$, . . . 21$k$+1, respectively, of the first inductor path 121 to the second terminal 102. The switching elements 732$a$, 732$b$ are configured to connect the inductor nodes 22a, 22b, respectively, of the second inductor path 122 to the second terminal 102. The switching elements 733a, 733b are configured to connect the inductor nodes 23a, 23b, respectively, of the third inductor path 123 to the second terminal 102. The switching element 743b is configured to connect the inductor node 24b of the fourth inductor path to the second terminal 102. The impedance selector 730 supports different impedance values connected to the first terminal 101 to be converted to an impedance of 50 ohm (or more generally: different impedance transformation rations), by selecting one of the plurality of switching elements to be in a conducting state while the other switching elements typically are in a non-conducting state. The supported impedance values are, for example, 50 ohm, 40 ohm, 30 ohm, 15 ohm, 10 ohm, 60 ohm, 75 ohm, 110 ohm, and 200 ohm.

The third inductor path 123 and the fourth inductor path 124 are connectable in parallel or in series with the second inductor path 122. To this end, the adjustable impedance matching network 700 comprises a parallel-serial connection unit with a plurality of switching elements 184, 186, 784, 785, and 786. The switching element 184 is configured to connect, when being in the conducting state, the inductor node 22a of the second inductor path 122 with the third inductor path 123. The switching element 186 is configured to connect, when being in the conducting state, the inductor node 22a of the second inductor path 122 with the reference potential terminal 103, i.e., with ground in the depicted embodiment. The switching elements 784, 786 have substantially the same functions for the inductor node 23a of the third inductor path 123. The switching element 785 is configured to connect, when being in the conducting state, the first terminal 101 with the fourth inductor path 124. Note that the second inductor path 122 is permanently connected to the first terminal 101 so that the switching element 785 allows the second and fourth inductor paths 122, 124 to be connected in parallel between the first terminal 101 and the reference potential terminal 103. The functions of the switching elements 184, 186, 784, 785, and 786 will become more evident below in the context of the description of the FIGS. 17B to 17G.

In the embodiment shown in FIG. 17A, four parallel windings have been used for the sake of example. As already illustrated in the basic circuit of FIG. 16, the low impedances are switched at the series inductor path 121 (Ls1), and the high impedances are switched the second, third, and fourth inductor paths 122, 123, 124. In the case of small impedances the structure 700 is used as a Ruthroff transformer, and in the case of high impedances the structure is used as an autotransformer. In order to improve the impedance ratio the parallel inductance is reduced by commutating the second, third, and fourth inductor paths 122, 123, 124 from a series connection structure to a parallel connection structure. This commutation from a series connection structure to a parallel connection structure may also happen in intermediate steps.

In the FIGS. 17B to 17E to be described below, the adjustable impedance matching network 700 is illustrated in a Ruthroff transformer configuration, whereas in the FIGS. 17F and 17G described below the adjustable impedance matching network 700 is illustrated in an autotransformer configuration.

Figure 17B:
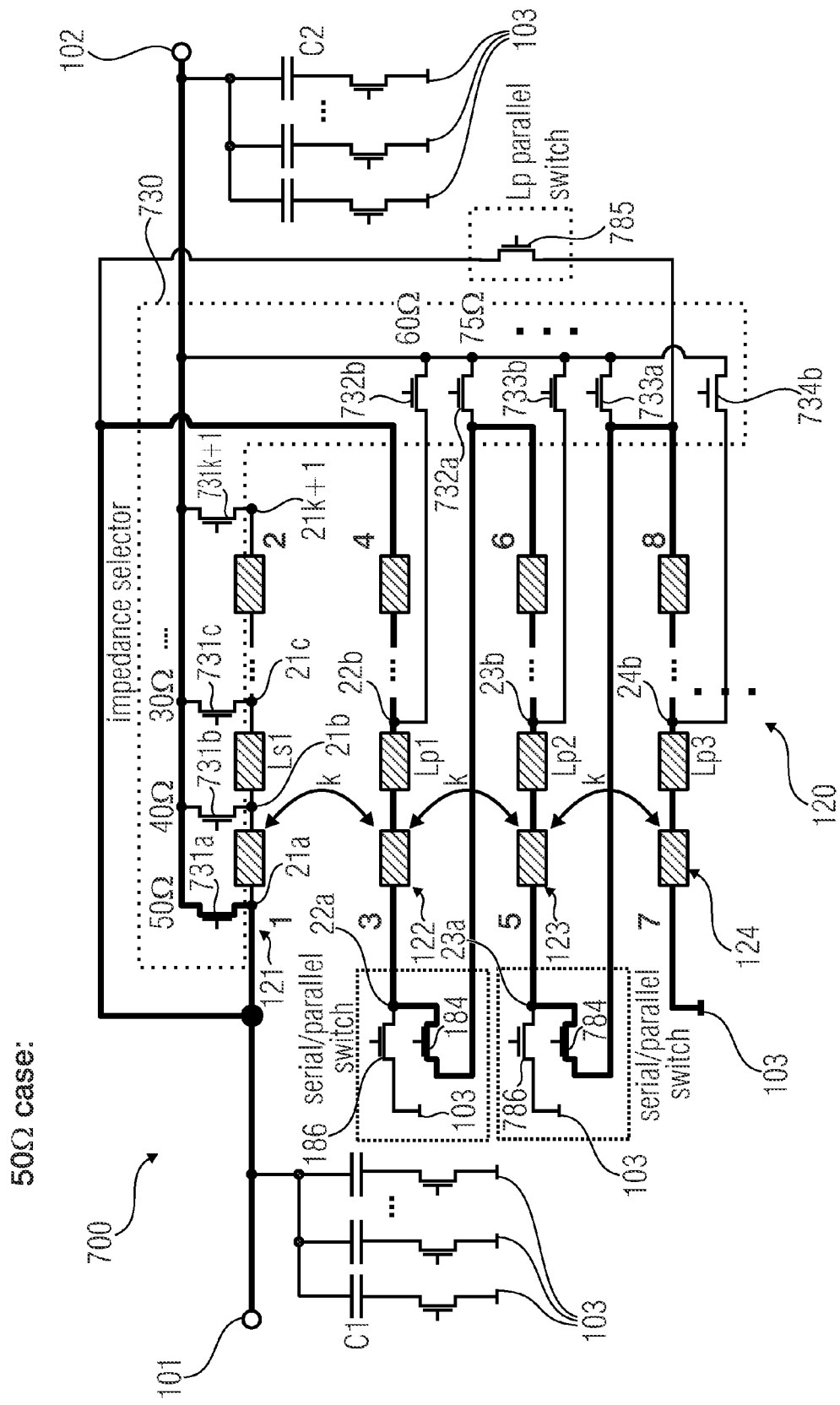
FIGS. 17B to 17G show the adjustable impedance matching network of FIG. 17A in different operating states.

FIG. 17B illustrates the adjustable impedance matching network 700 when the switches are controlled in accordance with a 50 ohm case, i.e., an impedance between the first terminal 101 and the reference potential terminal 103 to be transformed has a value of approximately 50 ohm. In this case, the switching element 731a is in a conducting state so that the first terminal 101 and the second terminal 102 are directly connected to each other. The adjustable impedance matching network functions as a by-pass switch. The second, third, and fourth inductor paths 122, 123, 124 are connected in series via the switching elements 184 and 784 of the parallel-series connection unit so that a high shunt inductance is obtained. This series connection of the second, third, and fourth inductor paths 122, 123, 124 provides a connection to ground which has a minor influence on the frequency band of interest. For lower frequencies, the series connection to ground suppresses the signal(s), as it behaves like a short circuit for low frequencies.

Figure 17C:
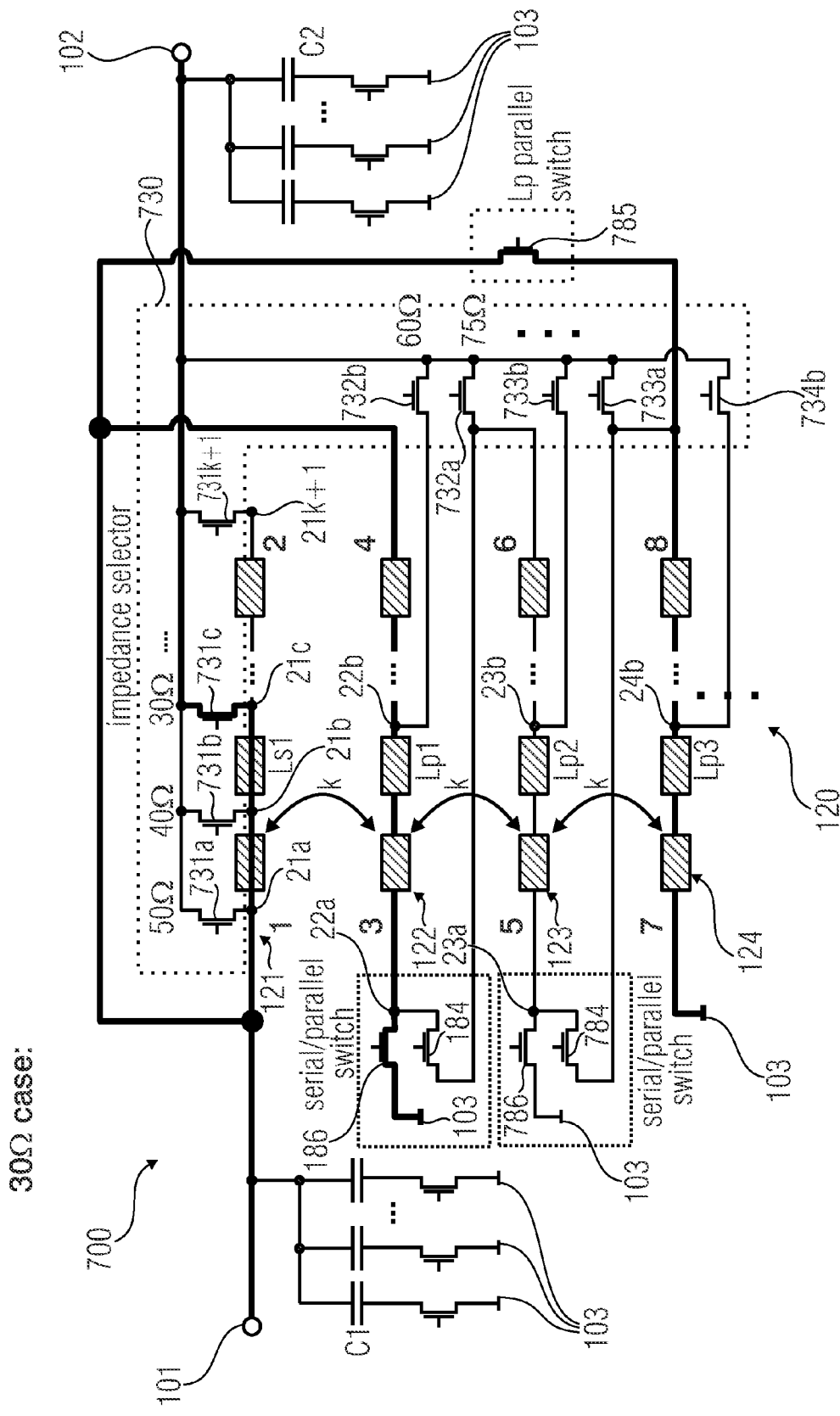

FIG. 17C illustrates the adjustable impedance matching network 700 when the switches are controlled in accordance with a 30 ohm case, i.e., an impedance between the first terminal 101 and the reference potential terminal 103 to be transformed has a value of approximately 30 ohm. The switching element 731c of the impedance selector 730 is in its conducting state so that the sub-section of the first inductor path 121 between the inductor nodes 21a and 21c is connected between the first and second terminals 101, 102. The remaining sub-sections of the first inductor path 121 are by-passed by the action of the switching element 731c. The second inductor path 122 and the fourth inductor path 124 form a parallel connection between the first terminal 101 and the reference potential terminal 103. To this end, the switching elements 186 and 785 of the parallel-series connection unit are controlled to be in their conducting states.

Figure 17D:
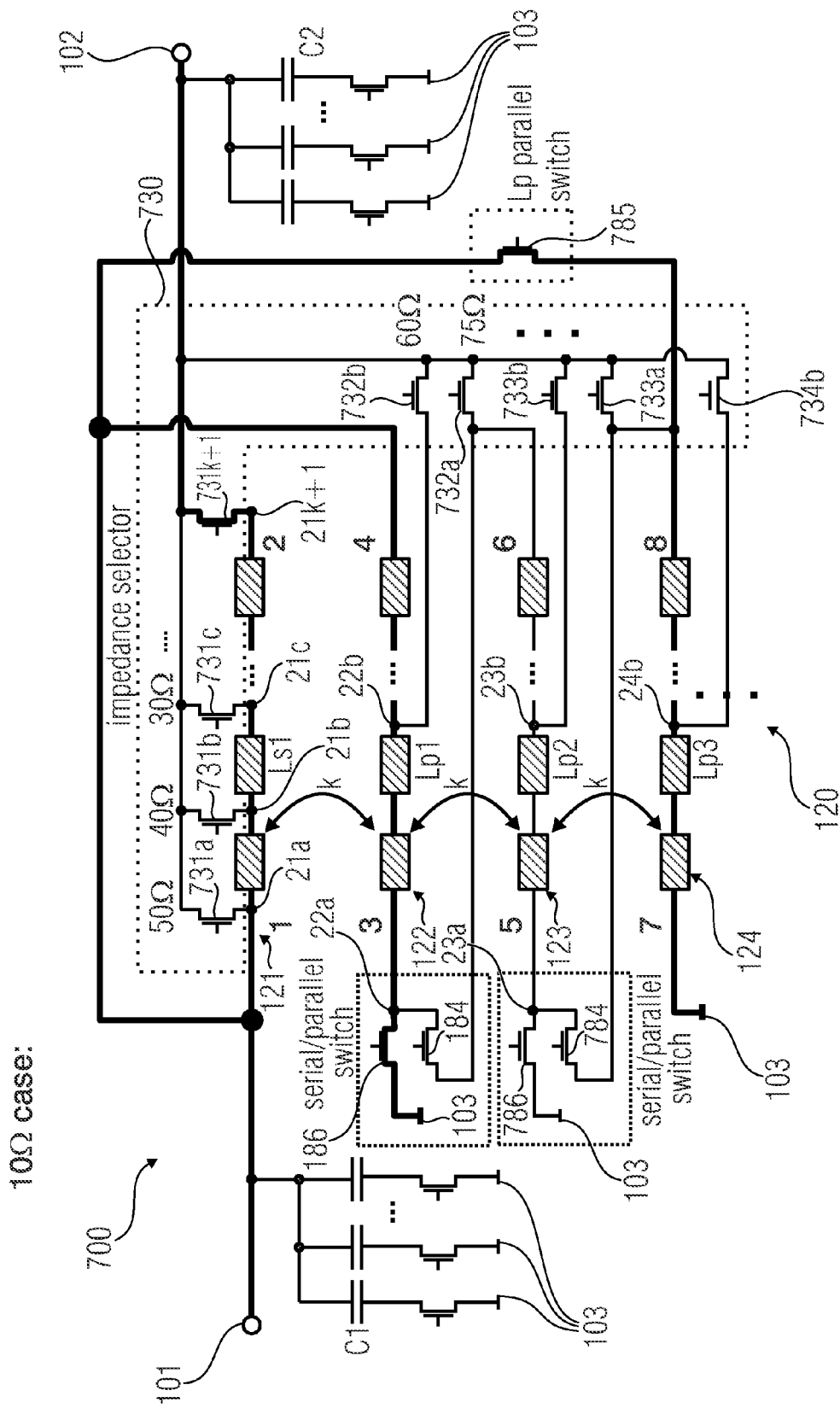

FIG. 17D illustrates the adjustable impedance matching network 700 when the switches are controlled in accordance with a 10 ohm case, i.e., an impedance between the first terminal 101 and the reference potential terminal 103 to be transformed has a value of approximately 10 ohm. The switching element 731$k$+1 of the impedance selector 730 is in its conducting state so the entire first inductor path 121 between the inductor nodes 21a and 21$k$+1 is connected between the first and second terminals 101, 102. As in the 30 ohm case illustrated in FIG. 17C, the second inductor path 122 and the fourth inductor path 124 form a parallel connection between the first terminal 101 and the reference potential terminal 103. To this end, the switching elements 186 and 785 of the parallel-series connection unit are controlled to be in their conducting states.

Figure 17E:
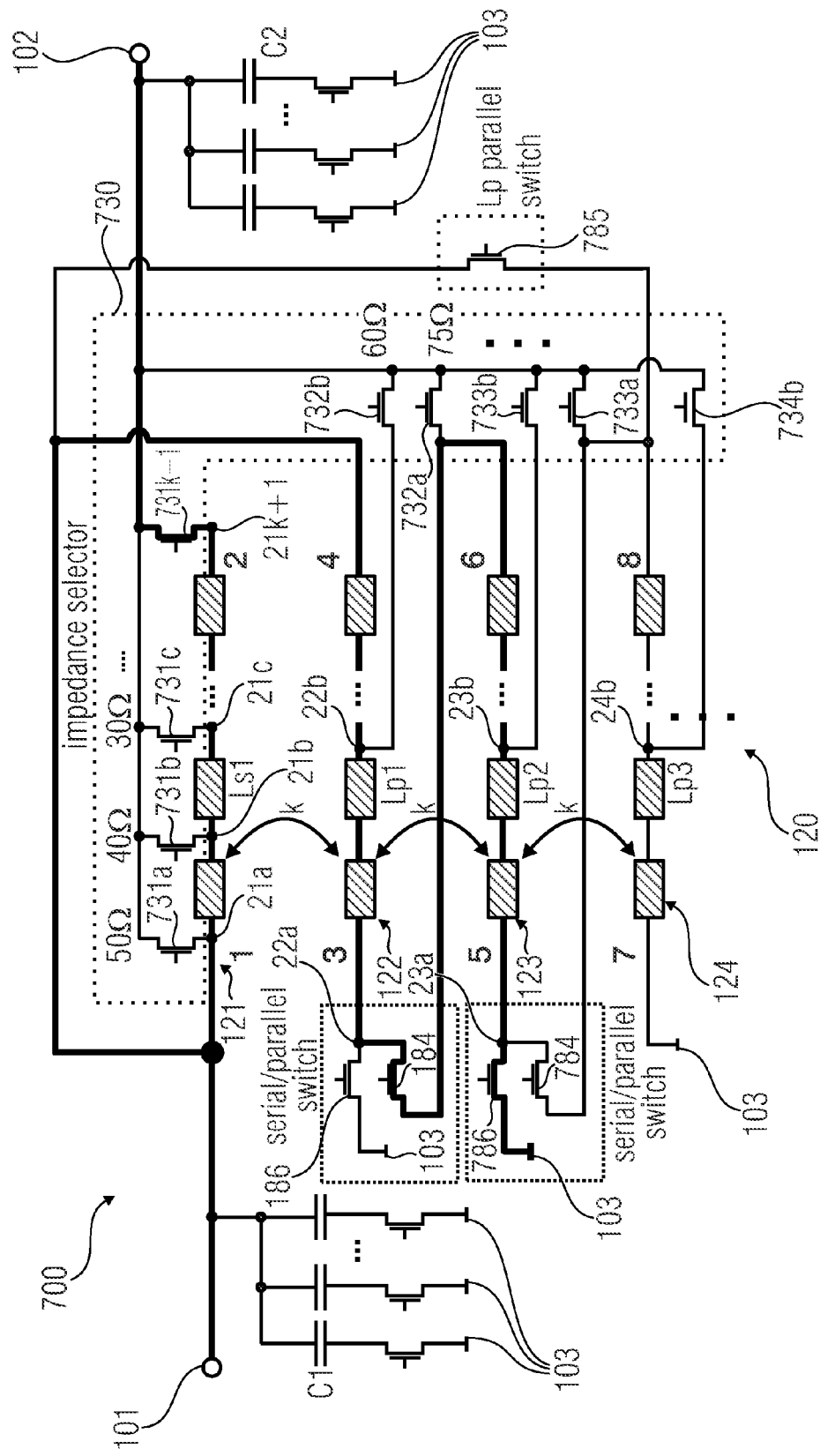

FIG. 17E illustrates the adjustable impedance matching network 700 when the switches are controlled in accordance with a 22.2 ohm case, i.e., an impedance between the first terminal 101 and the reference potential terminal 103 to be transformed has a value of approximately 22.2 ohm. As in the configuration according to FIG. 17D, the switching element 731$k$+1 of the impedance selector 730 is in the conducting state in order to connect the first inductor path 121 between the first terminal 101 and the second terminal 102. Contrary to the configuration of FIG. 17D, a series connection of the second inductor path 122 and the third inductor path 123 connects the first terminal 101 to the reference potential terminal 103. To this end, the switching elements 184 and 786 of the parallel-switching unit are in their conducting states.

Figure 17F:
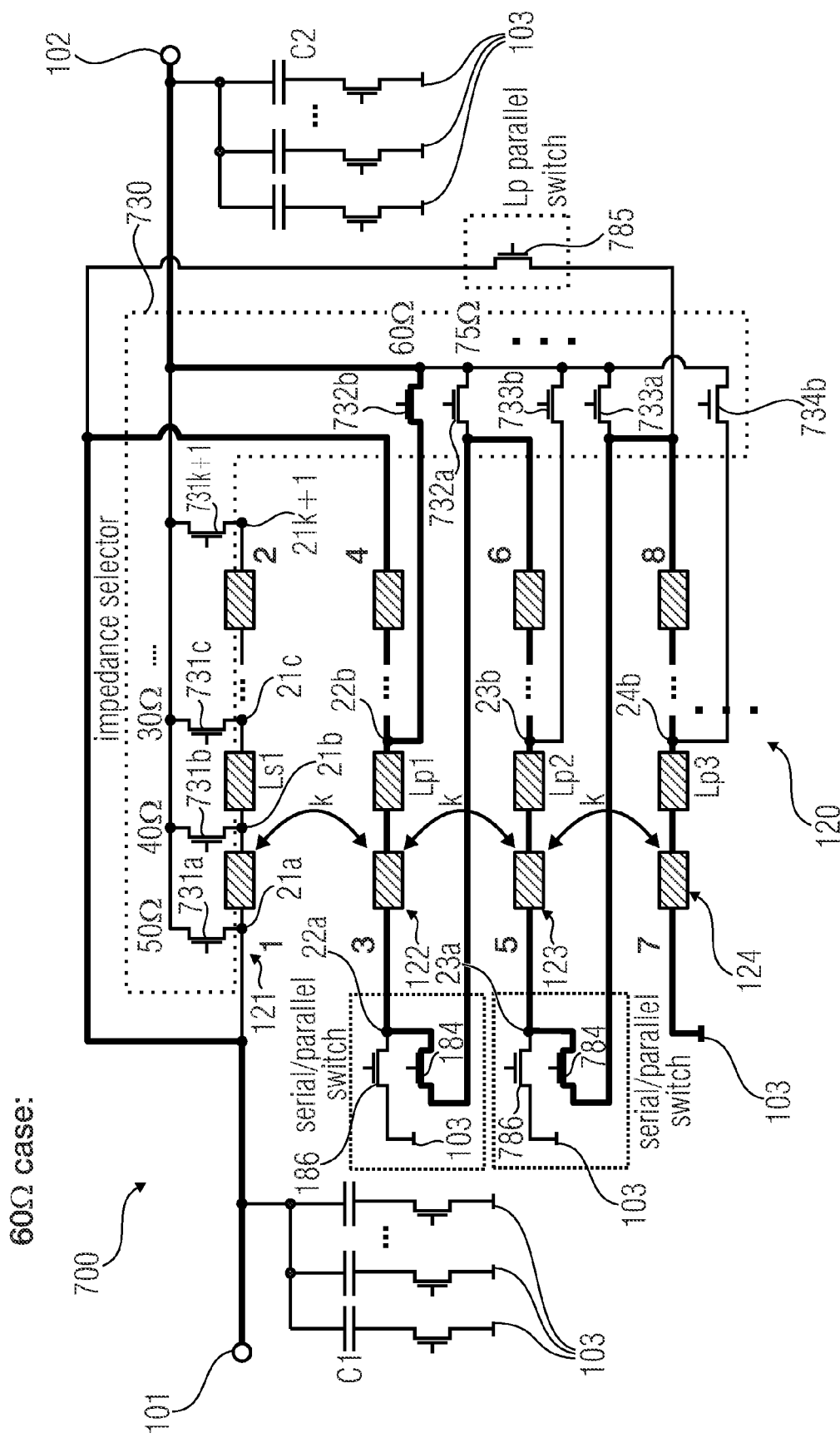

FIG. 17F illustrates the adjustable impedance matching network 700 when the switches are controlled in accordance with a 60 ohm case, i.e., an impedance between the first terminal 101 and the reference potential terminal 103 to be transformed has a value of approximately 60 ohm. The adjustable impedance matching network 700 is substantially configured as an autotransformer in this case. The switching element 732b of the selector switch 730 is in its conducting state in order to electrically connect the inductor node 22b to the second terminal 102. The second, third, and fourth inductor path 122, 123, 124 are connected in series between the first terminal 101 and the reference potential terminal 103 using the switching elements 184 and 784 of the parallel-series connection unit. The first inductor path 121 is bypassed.

Figure 17G:
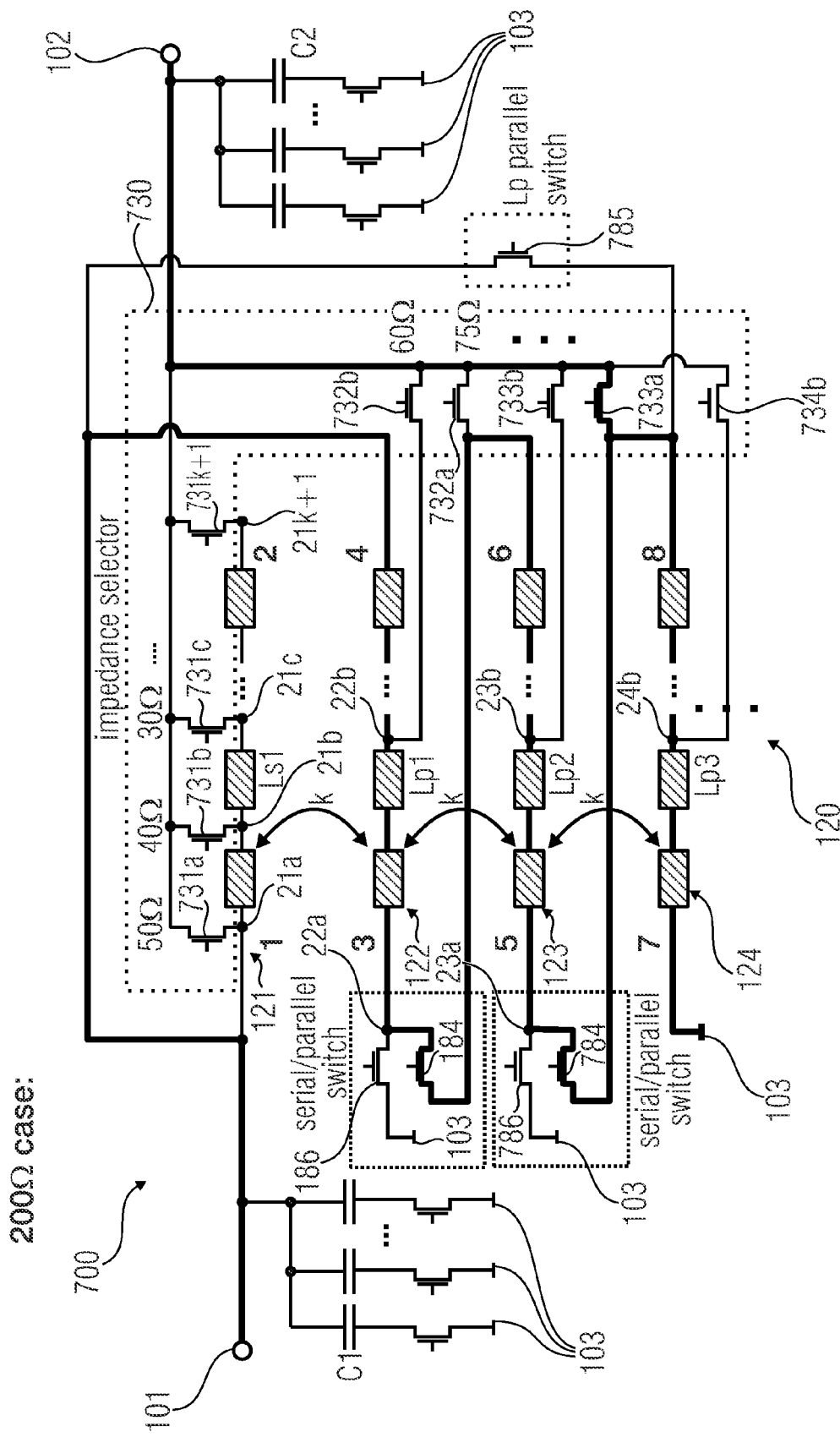

FIG. 17G illustrates the adjustable impedance matching network 700 when the switches are controlled in accordance with a 200 ohm case, i.e., an impedance between the first terminal 101 and the reference potential terminal 103 to be transformed has a value of approximately 60 ohm. The switching element 733a of the impedance selector 730 is in its conducting state to electrically connect the node 23a of the second inductor path 122 with the second terminal 102. The switching elements 184 and 784 are also in their conducting states so that the second, third, and fourth inductor paths 122, 123, 124 are connected in series, as in the configuration of FIG. 17F. The first inductor path 121 is bypassed. Note that according to the 200 ohm configuration shown in FIG. 17G, three switching elements 184, 784 and 733a are connected in series between the first terminal 101 and the second terminal 102. Although this series connection of three switching elements results in a high resistance or impedance to be inserted between the first and second terminals 101, 102, it does not negatively affect the performance of the adjustable impedance matching network 700 in an unacceptable manner, because the impedance to the transformed is relatively high, anyway. In other words, the losses are higher for high impedances than for smaller impedances. Nevertheless, the larger series resistances are less dominant in these high impedance cases than for smaller impedances, i.e., an assumed combined transistor resistance of, for example, 30 ohm is less dominant in the case of 500 ohm loads than for a target impedance of 5 ohm.

The following table summarizes the different configurations for some of the impedance matching cases of FIGS. 17B to 17G, as well as further impedance matching cases. An 'X' in a field of the table indicates that the switch is conducting in the impedance matching case. An empty cell indicates that the switch is non-conducting in the impedance matching case.

| | Impedance Matching Case | | | | | | | | | | |
|---|---|---|---|---|---|---|---|---|---|---|---|
| switch: | 10 ohm | 15 ohm | 22 ohm | 30 ohm | 35 ohm | 40 ohm | 50 ohm | 60 ohm | 75 ohm | 110 ohm | 200 ohm |
| 731a | | | | | | | X | | | | |
| 731b | | | | | | X | | | | | |
| 731c | | | X | | | | | | | | |
| 731d | | X | | | X | | | | | | |
| 731k + 1 | X | | X | | | | | | | | |
| 732b | | | | | | | | X | | | |
| 732a | | | | | | | | | X | | |
| 733b | | | | | | | | | | X | |
| 733a | X | X | | | | | | | | | X |
| 734b | | | | | | | | | | | |
| 184 | | | X | | X | | X | X | X | X | X |
| 186 | X | X | | X | X | | | | | | |
| 784 | | | | X | X | | X | X | X | X | X |
| 786 | | X | X | X | | X | | | | | |
| 785 | X | X | X | | | | | | | | |

Note that for the 30 ohm case, the 35 ohm case, and the 40 ohm case several combinations are possible in general (e.g., by switching one or more of the inductor paths 122, 123, 124 and/or using any one of the switches 731a to 731k+1). For higher frequencies it may typically be better to use the inductor paths 122, 123, 124 in parallel switch combinations, whereas for lower frequencies it may typically be better to keep the inductor paths 122, 123, 124 (or some of these) in series.

Figure 18:
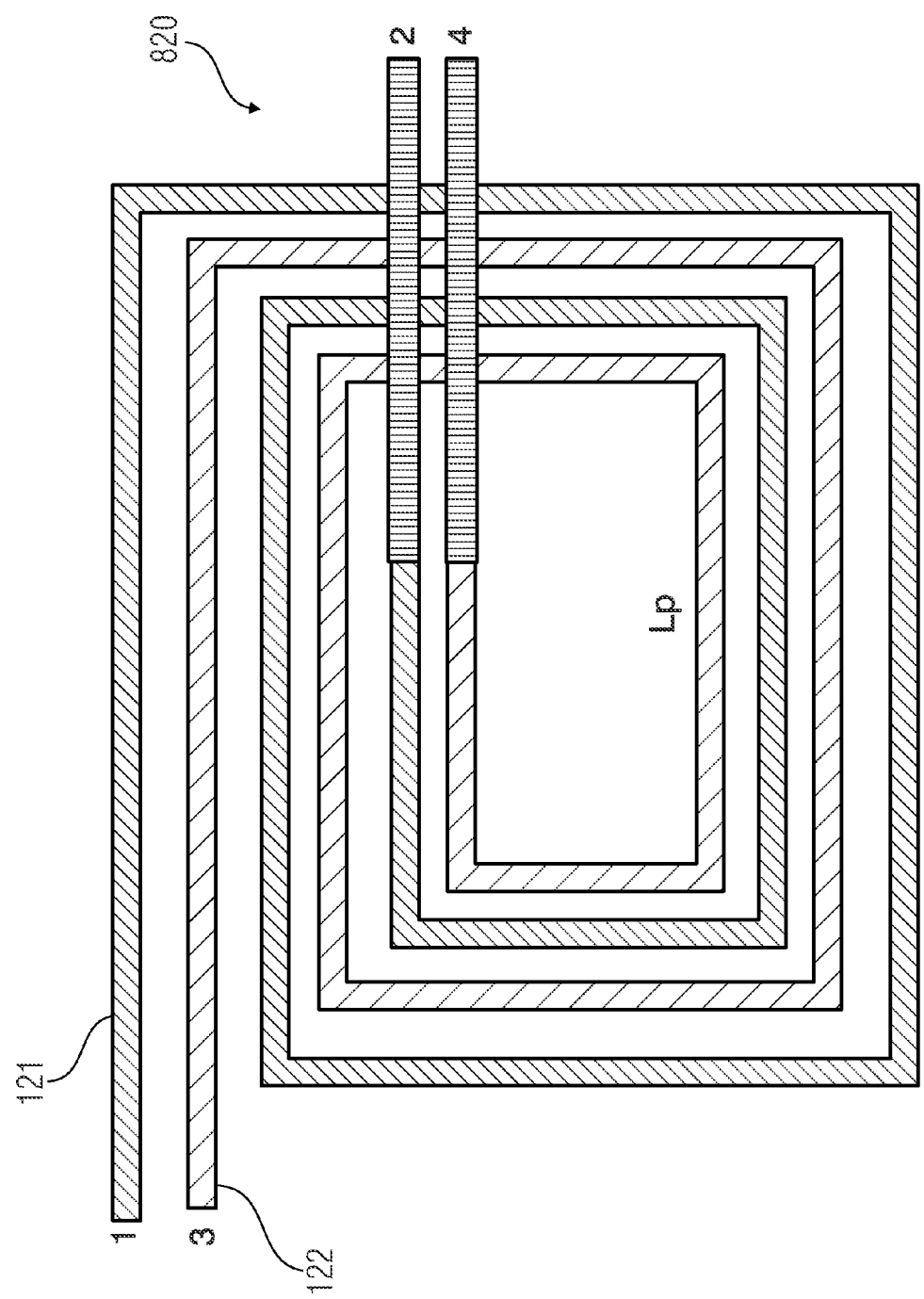
FIG. 18 illustrates a possible implementation of a transmission line transformer as a planar transformer.

FIG. 18 shows in a schematic manner a top view of a planar transmission line transformer 820. In general, the transmission line transformer may be realized in a passive integration or, alternatively, accommodated in a laminate (e.g., a printed circuit board). Other implementations of the transmission line transformer are also possible, such as a transformer integrated in a silicon substrate or EWLB (Embedded Wafer Level Ball Grid Array). The transmission line transformer 820 comprises the first inductor path 121 and the second inductor path 122. The first inductor path 121 extends between the terminals numbered 1 and 2 in FIG. 18. The second inductor path 122 extends between the terminals numbered 2 and 4 in FIG. 18. In other configurations, the transmission line transformer may comprise a third inductor path and possibly even further inductor paths. When using a planar transformer 820 as shown in FIG. 18, the transformer 820 may be tapped at suitable locations in order to obtain the desired impedance switching ratio.

Figure 19:
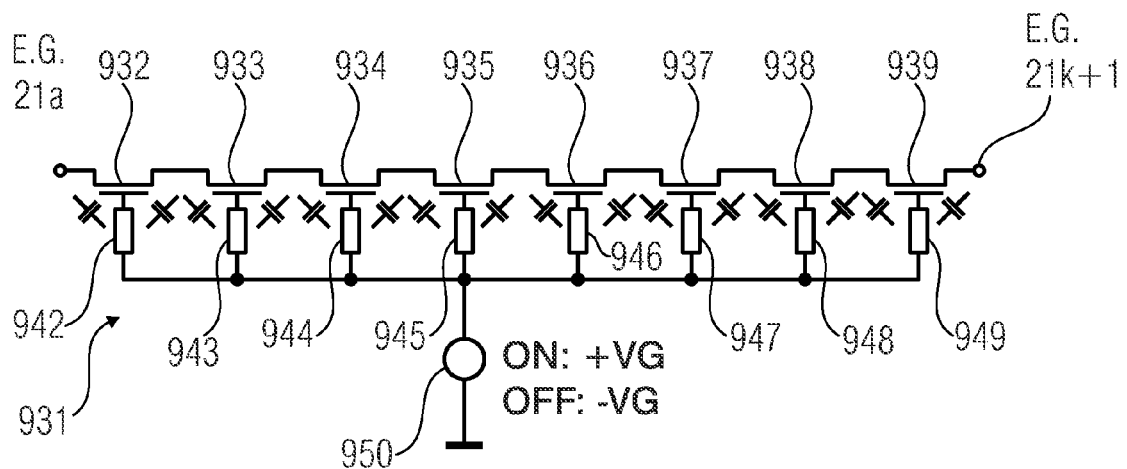
FIG. 19 shows a circuit schematic of a stacked arrangement of a plurality of switching elements.

FIG. 19 shows a circuit schematic of a switching element 931 that may be interposed between, for example, the inductor nodes 21a and 21k+1, or any other inductor nodes of the previously described embodiments. The switching element 931 comprises a plurality of stacked elementary switching units 932 to 939. In other words, the semiconductor switching element 931 comprises a plurality of stacked elementary switching units 932 . . . 939 with a number the stacked switching elements corresponding to an expected voltage across the semiconductor switching element 931. The elementary switching units are field effect transistors in the depicted embodiment which are controlled by a common control signal provided by a control signal source 950. The gates of the elementary switching units 932 to 939 are individually connected to the control signal source 950 via a corresponding resistor of a plurality of resistors 942 to 949. When the control signal provided by the control signal source is at a value −VG, the elementary switching units 932 to 939 are off. When the control signal is at a value +VG, the elementary switching units 932 to 939 are on, i.e., in their conducting states.

The several elementary switching units 932 . . . 939 are stacked in order to support the voltage swings that may occur. For example, 36 dBm (corresponding to 4 W) applied to a 50 ohm impedance lead to a high frequency voltage swing of 20V, that a transistor with e.g., a 3V breakdown voltage is not able to support. Therefore, the switching paths required to support relatively high voltage swings typically look as shown in FIG. 19.

In the switched-on state a positive electrical voltage is applied to the gates of the NMOS transistors 932 . . . 939 via the resistors 942 . . . 949. This lead to the switching path becoming conductive for HF signals. In the contrary case a negative voltage leads to blocking and an HF voltage builds up (if ground or a terminating resistor is connected at one terminal of the switching path 931). Due to the capacities between source/gate and gate/drain schematically indicated in FIG. 19, the HF voltage builds up equally over all transistors 932 . . . 939.

For the selector switch this means that as many series transistors are needed that the maximal power does not cause a breakdown or an auto-pinchoff (via capacitive coupling into the gate). For the parallel-serial switch at the second winding, not the same voltage swing occurs because a major part of the voltage is dropped over the inductivity. For this reason, fewer transistors need to be stacked, and in this manner a smaller series resistance can be obtained. Accordingly, a further switching element in addition to the switching element 931 may comprise a further plurality of stacked elementary switching units with a further number of stacked elementary switching units corresponding to an expected (maximal) voltage across the further semiconductor switching element, wherein the further number is different from the number of the stacked elementary switching units of the first semiconductor switching element 931.

In general, the number of stacked elementary switching units corresponds to the (expected) voltage requirements at the corresponding location within the circuit.

Figure 20:
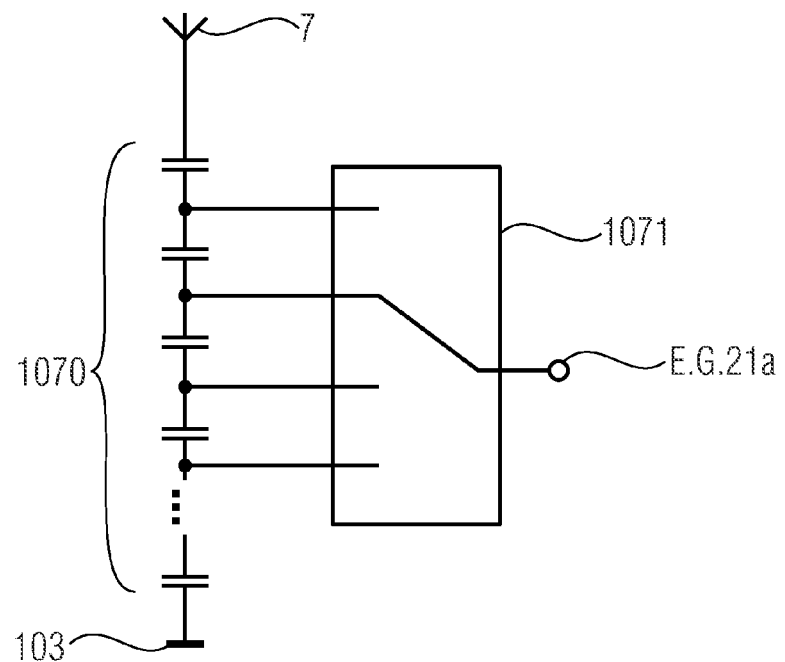
FIG. 20 shows a circuit schematic of a capacitor bank and a selector switch connected thereto.

FIG. 20 shows a circuit schematic of a capacitor bank 1070 and a selector switch 1071 connected thereto. The capacitor bank 1070 is connected to the antenna 7 and to the reference potential terminal 103. The selector switch 1071 comprises a plurality of input switches which are connected to corresponding capacitor bank nodes. A common terminal of the selector switch is, for example, connected to the inductor node 21a. The capacitor bank 1070 functions as a voltage divider.

FIG. 21 graphically illustrates the results of a simulation of the adjustable impedance matching network 700 of FIG. 17B, i.e., configured according to the unmatched 50 ohm case. The upper part of FIG. 21 shows a Smith chart in which input reflection coefficient S(1,1) for different frequencies from 500 MHz to 3 GHz is represented. A first sample that is indicated by a marker m3 in the Smith chart has been taken at a frequency of 900 MHz. A second sample that is indicated by a marker m4 in the Smith chart has been taken at a frequency of 2.7 GHz.

The lower part of FIG. 21 shows the frequency behavior of the forward transmission S(2,1) of the adjustable impedance matching network 700 in the unmatched 50 ohm case. At a frequency of 900 MHz the forward transmission S(2,1) is −0.771 dB which is almost at the maximum of the forward transmission curve.

FIG. 22 is similar to FIG. 21 and graphically illustrates the simulation results for the matched 15 ohm case. This case corresponds substantially to the 22.2 ohm case, the corresponding configuration being shown in FIG. 17E. The Smith chart shows that the input reflection coefficient S(1,1) varies more markedly in particular for low frequencies between 500 MHz and 900 MHz. In the graph which illustrates the forward-transmission over frequency it can be seen that the frequency selective behavior becomes more narrow compared to the unmatched 50 ohm case of FIG. 21. The maximum of the forward transmission S(2,1) is reached at approximately 1.1 GHz.

FIG. 23 is also similar to FIG. 21 and graphically illustrates the simulation results for the matched 110 ohm case. The Smith chart reveals that the frequency dependency of the input reflection coefficient S(1,1) has further increased, also for higher frequencies. The diagram illustrating the forward transmission over frequency shows that the maximum is reached approximately at 900 MHz and that the bandwidth behavior is still narrower than in the matched 15 ohm case of FIG. 22 (note the different scales of the ordinate axes of FIGS. 22 and 23). In the cases illustrated in FIGS. 22 and 23, the simulation is based on a standard CMOS process. The transformer is not perfectly optimized and has rather high self-capacitance.

The lower bandwidth for the autotransformer usage (>60 Ohm) typically is less problematic as it may appear initially. Due to the higher inductance the "tap points" shift. Thus, for e.g. 2.7 GHz much smaller inductances are required, and this means, that the same switch-bank is used, but just another tap is selected. It would also be possible to switch windings 122,123,124 (see, e.g., FIG. 17A) in parallel to improve on the circuit with respect to series resistance. In the plots illustrated in FIGS. 22 and 23, a high substrate capacitance of the transformer causes the smith curve to shift down to lower impedances.

Figure 24:
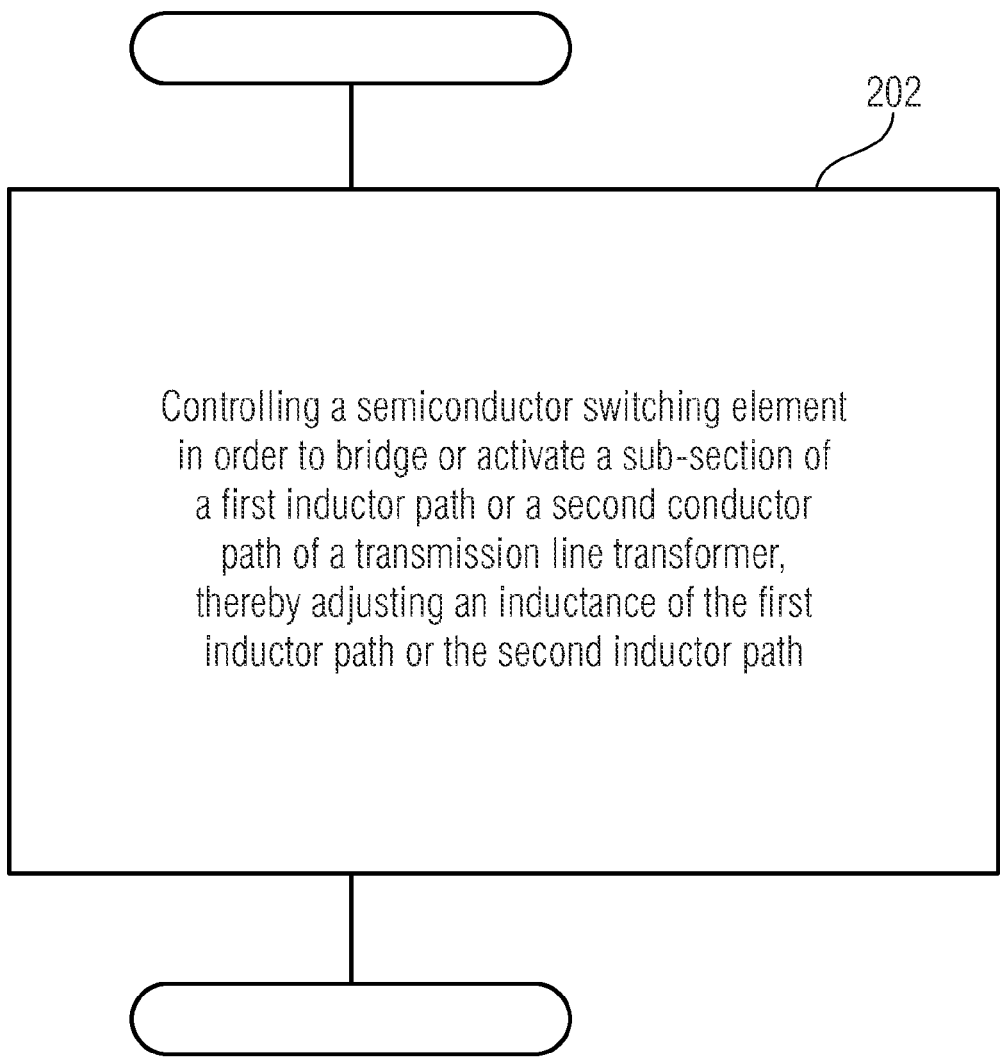
FIG. 24 show a schematic flow chart of a method for an adjustable impedance matching network according to at least some embodiments of the teachings disclosed herein.

FIG. 24 shows a schematic flow diagram of a method for adjusting an adjustable impedance matching network according to the teachings disclosed herein. After a start of the method an action 202 is performed during which a semiconductor switching element (or several semiconductor elements) are controlled to in order to bridge or activate a subsection of a first inductor path or a second inductor path of a transmission line transformer. In this manner an inductance of the first inductor path or of the second inductor path may be adjusted. In more elaborate embodiments of the method for adjusting an adjustable impedance matching network according to the disclosed teachings, a plurality of semiconductor switching elements may be controlled, such as the switching elements of the inductance selector 730 of the embodiments shown in FIG. 17A. Therefore, the method may comprise actions for controlling the adjustable impedance matching network to function in a Ruthroff transformer mode or in an autotransformer mode. In addition or in the alternative, the method may comprise actions for connecting two or more inductor paths in series or in parallel. In general, the method may comprise any action that is described above in the context of the adjustable impedance matching network itself.

Figure 25:
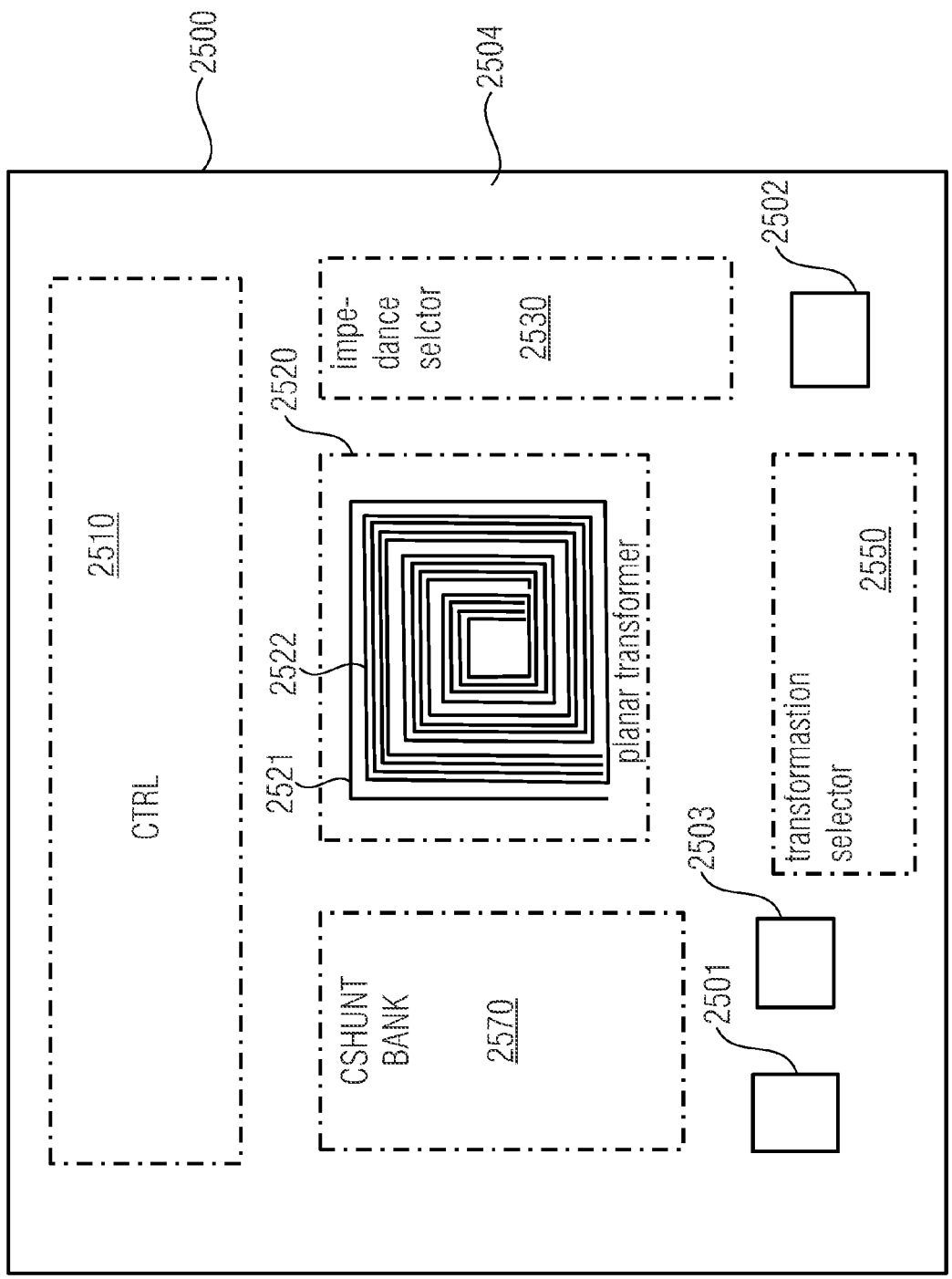
FIG. 25 illustrates a schematic top view of an integrated circuit according to at least some embodiments of the teachings disclosed herein.

FIG. 25 illustrates in a schematic manner a top view of an integrated circuit 2500 for adjustable impedance matching. The integrated circuit 2500 comprises a substrate 2504, a first connection pad 2501, a second connection pad 2502, a reference potential connection pad 2503, a first inductor path 2521, a second inductor path 2522, and a switching element 2530 or 2550. The switching element may be an impedance selector 2530 or a transformation selector 2550. The integrated circuit 2500 shown in FIG. 25 further comprises a controller 2510 and a capacitor shunt bank (CSHUNT BANK) 2570.

The first and second inductor paths 2521, 2522 are part of a transmission line transformer 2520. The first inductor path 2521 and the second inductor path 2522 are formed by conductive paths at or in the substrate. The first inductor path 2521 is conductively couplable between the first pad 2501 and the second pad 2502. The first and second inductor paths 2521, 2522 are mutually inductively coupled to form the transmission line transformer 2500. For example, the conductive paths may be highly doped regions within the substrate. Another possibility is to implement the first and second inductor paths 2521, 2522 (and possible further inductor paths) using a structured metallization of a surface of the substrate 2504.

The switching element 2530 or 2550 is configured to bridge the sub-section of the first inductor path to thereby adjust an inductance of the first inductor path or the second inductor path.

The embodiments of the disclosed teachings the switching element may be part of a switching arrangement configured to selectively connect one of a plurality of inductor nodes of the first inductor path 2521 and/or the second inductor path 2522 with at least one of the first connection pad 2501 and the second connection pad 2502.

The integrated circuit 2500 may further comprise a reconfiguration unit configured to selectively connect the second inductor path 2522 in a first configuration and in a second configuration. In the first configuration a first end of the second inductor path 2522 is connected to the first connection pad 2501 and a second end of the second inductor path 2522 is connected to the reference potential pad 2503. In the second configuration the first end is connected to the reference potential connection pad 2503 and the second end is connected to the second connection pad 2502. The functionality of the reconfiguration unit may be provided by the impedance selector 2530, the transformation selector 2550, by both the impedance selector 2530 and the transformation selector 2530, or by a further subsystem of the integrated circuit.

The capacitor shunt bank 2570 may be used as a first impedance and a second impedance. The first impedance is coupled between the first connection pad 2501 and the reference potential pad 2503. The second impedance is connected between the second connection pad 2502 and the reference potential pad 2503. The adjustable impedance matching network forms a Pi-network with the first inductor path 2521 acting as a series element of the Pi-network.

The transmission line transformer 2520 may further comprise a third inductor path. Furthermore, the integrated circuit 2500 may comprise a parallel-serial connection unit configured to selectively connect the second inductor path and the third inductor path in a parallel connection or a serial connection.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. An adjustable impedance matching network comprising:
   a first terminal;
   a second terminal;
   a reference potential terminal;
   a transmission line transformer with a first inductor path and a second inductor path; and
   a semiconductor switching element configured to bridge a sub-section of the first inductor path or the second inductor path to thereby adjust an inductance of the first inductor path or the second inductor path; and
   a reconfiguration unit configured to connect the second inductor path in a first configuration and in a second configuration,
   wherein in the first configuration a first end of the second inductor path is connected to the first terminal and a second end of the second inductor path is connected to the reference potential terminal, and
   wherein in the second configuration the first end is connected to the reference potential terminal and the second end is connected to the second terminal.

2. The adjustable impedance matching network according to claim 1, wherein the first inductor path is conductively couplable between the first terminal and the second terminal, and wherein the second inductor path is conductively couplable between the reference potential terminal and the first terminal.

3. The adjustable impedance matching network according to claim 1, further comprising a pole reversal element configured to reverse a polarity of the first inductor path or the second inductor path.

4. The adjustable impedance matching network according to claim 1, wherein the transmission line transformer is a Ruthroff transformer or a Guanella transformer.

5. The adjustable impedance matching network according to claim 1, wherein the transmission line transformer is one of a planar transformer, a printed circuit board integrated transformer, a semiconductor transformer, a transformer based on redistribution layer technology, and a combination of thereof.

6. The adjustable impedance matching network according to claim 1, wherein the transmission line transformer further comprising a plurality of additional inductor paths that are connectable in parallel or in series with the second inductor path.

7. The adjustable impedance matching network according to claim 1, wherein the semiconductor switching element is configured to bridge the entire first inductor path so that the first terminal and the second terminal are connected via the semiconductor switching element.

8. The adjustable impedance matching network according to claim 1, wherein the semiconductor switching element belongs to a plurality of switching elements forming a selector switch configured to selectively connect one of a plurality of inductor nodes of the first inductor path or the second inductor path to the first terminal or the second terminal.

9. The adjustable impedance matching network according to claim 8, wherein the plurality of inductor nodes comprises nodes of the first inductor path and the second inductor path.

10. The adjustable impedance matching network according to claim 1, wherein the transmission line transformer further comprises a third inductor path and wherein the adjustable impedance matching network further comprises a parallel-serial connection unit configured to selectively connect the second inductor path and the third inductor path in a parallel connection or a serial connection.

11. The adjustable impedance matching network according to claim 10, wherein the parallel-serial connection unit comprises a plurality of semiconductor switching elements for selectively connecting respective nodes of the second inductor path and the third inductor path to one of the first terminal, to the second terminal, to the reference potential terminal, and among each other.

12. The adjustable impedance matching network according to claim 1, wherein the semiconductor switching element comprises a plurality of stacked elementary switching units with a number of the stacked elementary switching units corresponding to an expected voltage across the semiconductor switching element.

13. The adjustable impedance matching network according to claim 12, further comprising a further semiconductor switching element that comprises a further plurality of stacked elementary switching units with a further number of stacked elementary switching units corresponding to an expected voltage across the further semiconductor switching element, wherein the further number is different from the number of the stacked elementary switching units.

14. The adjustable impedance matching network according to claim 1, further comprising
   a first terminal impedance coupled between the first terminal and the reference potential terminal; and
   a second terminal impedance coupled between the second terminal and the reference potential terminal;
   wherein the adjustable impedance matching network forms a Pi-network with the first inductor path acting as a series element of the Pi-network.

15. The adjustable impedance matching network according to claim 14, further comprising a further semiconductor switching element configured to adjust the first terminal impedance or the second terminal impedance.

16. The adjustable impedance matching network according to claim 14, wherein at least one of the first terminal impedance and the second terminal impedance is a substantially capacitive impedance.

17. An adjustable impedance matching network comprising:
   a first terminal;
   a second terminal;
   a reference potential terminal;
   a transmission line transformer comprising a first inductor path and a second inductor path;
   a selector switch configured to selectively connect one of a plurality of inductor nodes of the first inductor path and the second inductor path with at least one of the first terminal and the second terminal; and
   a pole reversal element configured to reverse a polarity of the first inductor path or the second inductor path.

18. The adjustable impedance matching network according to claim 17, further comprising:
   a reconfiguration unit configured to connect the second inductor path in a first configuration and in a second configuration,
   wherein in the first configuration a first end of the second inductor path is connected to the first terminal and a second end of the second inductor path is connected to the reference potential terminal, and
   wherein in the second configuration the first end is connected to the reference potential terminal and the second end is connected to the second terminal.

19. The adjustable impedance matching network according to claim 17, wherein the transmission line transformer is a Ruthroff transformer or a Guanella transformer.

20. The adjustable impedance matching network according to claim 17, further comprising a first terminal impedance coupled between the first terminal and the reference potential terminal; and a second terminal impedance coupled between the second terminal and the reference potential terminal;

wherein the adjustable impedance matching network forms a Pi-network with the first inductor path acting as a series element of the Pi-network.

21. The adjustable impedance matching network according to claim 17, wherein the transmission line transformer is one of a planar transformer, a printed circuit board integrated transformer, a semiconductor transformer, a transformer based on redistribution layer technologies, and a combination of thereof.

22. The adjustable impedance matching network according to claim 17, wherein the selector switch comprises a plurality of semiconductor switching elements, each semiconductor switching element being coupled between one of the plurality of inductor nodes and the first terminal or the second terminal.

23. The adjustable impedance matching network according to claim 17, wherein the selector switch is further configured to bridge the entire first inductor path so that the first terminal and the second terminal are connected via a semiconductor switching element.

24. The adjustable impedance matching network according to claim 17, wherein the selector switch comprises a plurality of stacked elementary switching units with a first number of the stacked elementary switching units corresponding to an expected voltage across a semiconductor switching element.

25. The adjustable impedance matching network according to claim 17, wherein the transmission line transformer further comprises a third inductor path and wherein the adjustable impedance matching network further comprises a parallel-serial connection unit configured to selectively connect the second inductor path and the third inductor path in a parallel connection or a serial connection.

26. The adjustable impedance matching network according to claim 25, wherein the parallel-serial connection unit comprises a plurality of semiconductor switching elements for selectively connecting respective nodes of the second inductor path and the third inductor path to one of the first terminal, to the second terminal, to the reference potential terminal, and among each other.

27. An integrated circuit for adjustable impedance matching, the circuit comprising:
a substrate;
a first connection pad;
a second connection pad;
a reference potential pad;
a first inductor path formed by a conductive path at or in the substrate, and conductively couplable between the first connection pad and the second connection pad;
a second inductor path formed by a conductive path at or in the substrate, wherein the first inductor path and the second inductor path are mutually inductively coupled to form a transmission line transformer; and
a switching element to bridge a sub-section of the first inductor path or the second inductor path to thereby adjust an inductance of the first inductor path or the second inductor path.

28. The integrated circuit according to claim 27, wherein the switching element is part of a selector switch arrangement configured to selectively connect one of a plurality of inductor nodes of the first inductor path and the second inductor path with at least one of the first connection pad and the second connection pad.

29. The integrated circuit according to claim 27, further comprising:
a reconfiguration unit configured to connect the second inductor path in a first configuration and in a second configuration,
wherein in the first configuration a first end of the second inductor path is connected to the first connection pad and a second end of the second inductor path is connected to the reference potential pad, and
wherein in the second configuration the first end is connected to the reference potential pad and the second end is connected to the second connection pad.

30. The integrated circuit according to claim 27, further comprising
a first impedance coupled between the first connection pad and the reference potential pad; and
a second impedance coupled between the second connection pad and the reference potential pad;
wherein an adjustable impedance matching network forms a Pi-network with the first inductor path acting as a series element of the Pi-network.

31. The integrated circuit according to claim 27, wherein a transmission line transformer further comprises a third inductor path and wherein the integrated circuit further comprises a parallel-serial connection unit configured to selectively connect the second inductor path and the third inductor path in a parallel connection or a serial connection.

32. A method for adjusting an adjustable impedance matching network, the adjustable impedance matching network comprising a first terminal, a second terminal, a reference potential terminal, a transmission line transformer with a first inductor path and a second inductor path, a semiconductor switching element and a reconfiguration unit, the method comprising:
controlling the semiconductor switching element in order to bridge or activate a sub-section of the first inductor path or the second inductor path of the transmission line transformer, thereby adjusting an inductance of the first inductor path or the second inductor path; and
controlling the reconfiguration unit in order to connect the second inductor path in a first configuration or in a second configuration,
wherein in the first configuration a first end of the second inductor path is connected to the first terminal and a second end of the second inductor path is connected to the reference potential terminal, and
wherein in the second configuration the first end is connected to the reference potential terminal and the second end is connected to the second terminal.

* * * * *